US011557658B2

(12) United States Patent
Dewey et al.

(10) Patent No.: US 11,557,658 B2
(45) Date of Patent: Jan. 17, 2023

(54) TRANSISTORS WITH HIGH DENSITY CHANNEL SEMICONDUCTOR OVER DIELECTRIC MATERIAL

(71) Applicant: INTEL CORPORATION, Santa Clara, CA (US)

(72) Inventors: Gilbert Dewey, Beaverton, OR (US); Sean T. Ma, Portland, OR (US); Tahir Ghani, Portland, OR (US); Willy Rachmady, Beaverton, OR (US); Cheng-Ying Huang, Hillsboro, OR (US); Anand S. Murthy, Portland, OR (US); Harold W. Kennel, Portland, OR (US); Nicholas G. Minutillo, Beaverton, OR (US); Matthew V. Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/649,592

(22) PCT Filed: Dec. 27, 2017

(86) PCT No.: PCT/US2017/068563
§ 371 (c)(1),
(2) Date: Mar. 20, 2020

(87) PCT Pub. No.: WO2019/132891
PCT Pub. Date: Jul. 4, 2019

(65) Prior Publication Data
US 2020/0287024 A1 Sep. 10, 2020

(51) Int. Cl.
H01L 29/66 (2006.01)
H01L 21/8238 (2006.01)
(Continued)

(52) U.S. Cl.
CPC ........... *H01L 29/66795* (2013.01); *H01L 21/823821* (2013.01); *H01L 27/0924* (2013.01); *H01L 29/785* (2013.01)

(58) Field of Classification Search
CPC ............ H01L 29/66795; H01L 29/785; H01L 27/0886; H01L 29/6681; H01L 21/76224;
(Continued)

(56) References Cited

U.S. PATENT DOCUMENTS 8,116,121 B2 * 2/2012 Kawasaki ........... H01L 27/1104
438/197
9,142,418 B1 * 9/2015 Jung ................. H01L 29/66795
(Continued)

OTHER PUBLICATIONS

International Preliminary Report on Patentability from PCT/US2017/068563 dated Jul. 9, 2020, 13 pgs.
(Continued)

*Primary Examiner* — Bac H Au
(74) *Attorney, Agent, or Firm* — Essential Patents Group, LLP

(57) ABSTRACT

Transistors having a plurality of channel semiconductor structures, such as fins, over a dielectric material. A source and drain are coupled to opposite ends of the structures and a gate stack intersects the plurality of structures between the source and drain. Lateral epitaxial overgrowth (LEO) may be employed to form a super-lattice of a desired periodicity from a sidewall of a fin template structure that is within a trench and extends from the dielectric material. Following LEO, the super-lattice structure may be planarized with surrounding dielectric material to expose a top of the super-lattice layers. Alternating ones of the super-lattice layers may then be selectively etched away, with the retained layers of the super-lattice then laterally separated from each other by a distance that is a function of the super-lattice period-
(Continued)

icity. A gate dielectric and a gate electrode may be formed over the retained super-lattice layers for a channel of a transistor.

9 Claims, 11 Drawing Sheets

(51) Int. Cl.
  *H01L 27/092* (2006.01)
  *H01L 29/78* (2006.01)
(58) Field of Classification Search
  CPC ..... H01L 21/823431; H01L 21/823437; H01L 21/823821; H01L 27/0924; H01L 29/0642; H01L 29/0649; H01L 29/0653
  See application file for complete search history.

(56) References Cited

U.S. PATENT DOCUMENTS

| | | | | |
|---|---|---|---|---|
| 9,614,058 | B2* | 4/2017 | Fronheiser | H01L 29/267 |
| 9,842,931 | B1* | 12/2017 | Anderson | H01L 21/3086 |
| 10,056,289 | B1* | 8/2018 | Cheng | H01L 29/66666 |
| 10,431,690 | B2* | 10/2019 | Rachmady | H01L 29/78696 |
| 10,510,853 | B2* | 12/2019 | Vellianitis | H01L 29/36 |
| 10,950,492 | B2* | 3/2021 | Cheng | H01L 29/42392 |
| 2005/0077553 | A1* | 4/2005 | Kim | H01L 21/823437 |
| | | | | 257/288 |
| 2013/0037869 | A1* | 2/2013 | Okano | H01L 29/66795 |
| | | | | 257/E21.409 |
| 2013/0134486 | A1 | 5/2013 | Licausi | |
| 2013/0256759 | A1* | 10/2013 | Vellianitis | H01L 29/36 |
| | | | | 257/E27.06 |
| 2014/0170998 | A1* | 6/2014 | Then | H01L 21/28575 |
| | | | | 257/192 |
| 2014/0357034 | A1* | 12/2014 | Cheng | H01L 29/785 |
| | | | | 438/275 |
| 2015/0061014 | A1* | 3/2015 | Jacob | H01L 29/66795 |
| | | | | 257/347 |
| 2015/0132920 | A1 | 5/2015 | Vellianitis et al. | |
| 2015/0162339 | A1* | 6/2015 | Divakaruni | H01L 29/7855 |
| | | | | 438/264 |
| 2015/0325487 | A1* | 11/2015 | Loubet | H01L 21/823878 |
| | | | | 438/157 |
| 2016/0322392 | A1* | 11/2016 | Mochizuki | H01L 21/30625 |
| 2018/0053651 | A1* | 2/2018 | Leobandung | H01L 21/3085 |
| 2018/0069005 | A1* | 3/2018 | Sporer | H01L 21/2256 |
| 2018/0144987 | A1* | 5/2018 | Liu | H01L 21/823431 |
| 2018/0308743 | A1* | 10/2018 | Cheng | H01L 29/66666 |
| 2020/0176448 | A1* | 6/2020 | Huang | H01L 21/823431 |

OTHER PUBLICATIONS

International Search Report and Written Opinion for PCT Application No. PCT/US16/68563, dated Sep. 21, 2018.

* cited by examiner

TRANSISTORS WITH HIGH DENSITY CHANNEL SEMICONDUCTOR OVER DIELECTRIC MATERIAL

CLAIM OF PRIORITY

This Application is a National Stage Entry of, and claims priority to, PCT Patent Application No. PCT/US17/68563, filed on 27 Dec. 2017 and titled "TRANSISTORS WITH HIGH DENSITY CHANNEL SEMICONDUCTOR OVER DIELECTRIC MATERIAL", which is incorporated by reference in its entirety for all purposes.

BACKGROUND

Device density in integrated circuits (ICs) continues to increase. Integrated circuits (e.g., microprocessors, chipset components, graphics chips, memory chips, optical chips, etc.) include transistors that now often have non-planar channel semiconductor structures, such as fin field effect transistors (finFETS). The density of such fins is an important metric for transistors, with higher fin density enabling transistors with higher currents/area or smaller footprints. To date, fins are typically formed by a lithographic process in which a photoresist layer may be spin-coated over a mask layer. The photoresist layer may be exposed to radiation through a patterned mask, and the exposed photoresist developed in order to form lines. Next, the hardmask may be etched and this line pattern translated into an underlying semiconductor material. One measure of the size of a trace is the critical dimension (CD). One measure of the spacing of a set of traces is their pitch. In the past, the sizes and the spacing of traces have progressively decreased. Various multi-patterning and pitch splitting techniques may be employed in an effort to further increase the density of a fin pattern. However, such patterning techniques are expensive and the surface roughness of fins resulting from these complex subtractive patterning techniques may still pose a practical limit in the lateral dimensions of the fins. Techniques and structures that enable further increases in fin density are therefore advantageous.

Fin leakage is another issue that becomes more problematic with transistor scaling. Losses through transistor leakage paths pose a significant program with respect to power consumption and signal integrity. In an effort to mitigate leakage through an IC substrate, transistors may be fabricated upon semiconductor-on-insulator (SOI) substrates. SOI substrates are much more expensive than bulk semiconductor substrates and therefore transistor fabrication techniques and architecture that improve transistor isolation without reliance on SOI substrates are also advantageous, with techniques and structures that enable both a further increase in fin density and improved substrate isolation being all the more advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

Figure 1A:
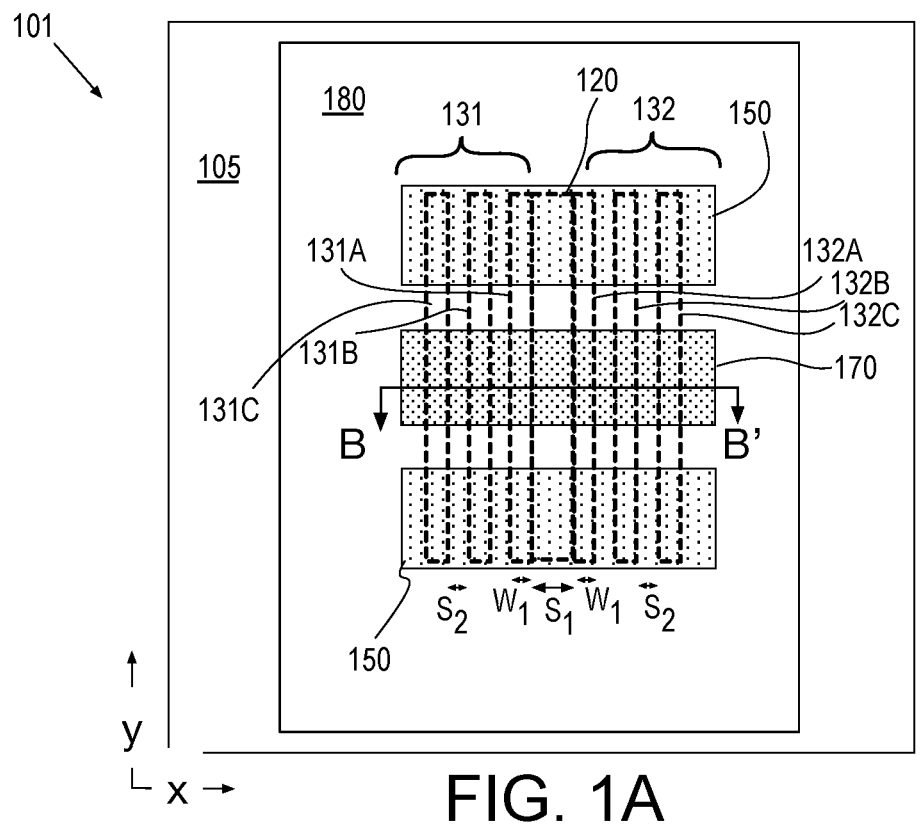
FIG. 1A is a plan view of a portion of an IC including a finFET with multiple crystalline fins surrounding a fin template, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Methods and architectures associated with additive fin patterning that can improve fin quality and density are described below. In some embodiments, crystalline fin layers are epitaxially grown from a sidewall of a fin template that is within a fin template trench extending through a surrounding dielectric material. The fin template includes a seeding sidewall having a desired crystallinity. The crystallinity of the fin template sidewall may be employed as a seeding surface for epitaxial growth that proceeds laterally, over the dielectric material that the fin template trench extends through. The lateral epitaxial overgrowth may form a superlattice structure that includes a plurality of bilayers. A planarization process may break through a portion of the superlattice structure to expose top surfaces of each of the epitaxial bi-layers. A selective etch may be employed to remove one of the bi-layers selectively to the other, thereby exposing sidewall of the surviving superlattice layers. A source, drain, and a gate stack may then be formed over these remaining layers to complete a multi-fin finFET. The fin template trench within the dielectric material may be retained in the final finFET structure and may remain filled with fin template material, a portion thereof, or an artifact associated therewith. Embodiments herein may enable transistors with greater fin density, and/or reduced fin edge roughness, and/or greater crystal quality, and/or greater substrate isolation.

Some exemplary embodiments described below illustrate structural features indicative of fabrication processes that apply the principles taught herein. For example, a transistor fabricated as described below may have one half of a plurality of fins on one side of a fin template trench while the other half of the fins is on another, opposite side of the fin template trench. A plurality of the transistor fins may be electrically isolated from an underlying layer (e.g., crystalline semiconductor) by an intervening dielectric material, while the fin template is within the template trench that extends through this dielectric material and is in contact with the underlying layer (e.g., crystalline semiconductor). In some further embodiments, the lateral dimensions of the transistor fins, or the spaces between the fins, varies symmetrically about the template trench defining a centerline of the plurality of fins.

FIG. 1A is a plan view of a portion of an integrated circuit (IC) including a multi-finned transistor 101, in accordance with some embodiments. In FIG. 1A, dashed line is employed to illustrate salient structural interfaces that are substantially covered by one or more overlying material layer. Transistor 101 may be an N-type (NMOS) or a P-type (PMOS) field effect transistor (FET), for example. In the exemplary embodiments, transistor 101 is over a portion of a substrate layer 105. Transistor 101 includes one or more fins 131 on a first side of a fin template 120 and one or more fins 132 on a second side of fin template 120, opposite fins 131. Fins 131 and 132 are substantially parallel to each other with a shortest fin length (i.e., transverse width) being in a first dimension (e.g., x) and a longest fin length (i.e., longitudinal length) in a second dimension (e.g., y). In the illustrated example, fins 131 include a fin 131A closest to fin template 120, a fin 131C farthest from fin template 120, and a fin 131B between fins 131A and 131C. Likewise, fins 132 include a fin 132A closest to fin template 120, a fin 132C farthest from fin template 120, and a fin 132B between fins 132A and 132C. Fins 131 (e.g., A-C) and fins 132 (e.g., A-C) are advantageously substantially identical structures configured into electrical parallel for greater current carrying capacity of transistor 101. A single gate electrode 170 extends in the x-dimension over a channel region of fins 131 and fins 132. Source and drain metallization 150 also extend in the x-dimension, with an underlying source and drain coupling ends of fins 131 and ends of fins 132 to source and drain metallization 150.

In some embodiments, a transistor includes an even number of fins with half of those fins on one side of a fin template, and another half of those fin on an opposite side of the fin template. Hence, in the illustrated example, the number of fins 131 (e.g., three) is equal to the number of fins 132 (e.g., three). This relationship holds for any number of fins from one fin on each side of fin template 120 to an arbitrary maximum number of fins on each side of fin template 120.

The pitch of fins 131 and fins 132 may vary with technology node. In some embodiments, fins 131 have a pitch of 20 nanometer (nm), or less. In some such embodiments, fins 132 also have a pitch of 20 nanometer (nm), or less. Fin pitch is equal to fin width $W_1$ summed with fin space width $S_2$. In some embodiments, fin width $W_1$ is 4-9 nm with fin space width $S_2$ also 4-9 nm. The longitudinal lengths of fins 131 may vary arbitrarily, for example as a function of gate length and/or as a function of the architecture of the source and drain. As further illustrated in FIG. 1A, fin template 120 occupies a space width $S_1$ that is larger than space width $S_2$. Fin template 120 may have a lateral dimension of 5-50 nm, for example. In some embodiments where space width $S_2$ is 4-9 nm, fin template 120 occupies a space width $S_1$ that is larger than 9 nm. It is noted however that fin template 120 may also have the same lateral dimensions as fins 431 and 432. Fins 131A and 132A are immediately adjacent to fin template 120. If coplanar with fins 131A and 132A, fin template 120 would be in direct contact (merged) with fins 131A and 132A. As such, fin 131A is spaced apart from fin 132A by space width $S_1$. Hence, fins 131 may have the same pitch as fins 132, however the two sets of fins 131 and 132 are separated by space width $S_1$ that may be different (e.g., larger) than space width $S_2$.

In some embodiments, fin width and/or the width of a space between adjacent fins varies symmetrically about a longitudinal centerline of a multi-finned transistor. For example, width of fins 131 may vary (e.g., increase or decrease) with distance from a centerline of fin template 120. The width of fins 132 may also vary (increase or decrease) with distance from a centerline of fin template 120 in the same manner as fins 131. In the example shown in FIG. 1A, both fin 131A and fin 132A have the fin width $W_1$. Fin 131B likewise has substantially the same width as fin 132B, even if the width of fins 131B and 132B is not equal to fin width $W_1$. Fin 131C likewise has substantially the same width as fin 132C, even if the width of fins 131C and 132C is not equal to fin width $W_1$. Hence, for embodiments where the widths of fins 131 and 132 increase, they do so symmetrically about fin template 120. For embodiments where the widths of fins 131 and 132 decrease, they do so symmetrically about fin template 120. In the example shown in FIG. 1A, both fins 131B and 131C are spaced apart by space width $S_2$. Fins 132B and 132C are also spaced apart by space width $S_2$. The space between fins 131B and 131A is also substantially the same as the space between fins 132B and 132A, even if this space is not equal to space width $S_2$. Hence, for embodiments where the spaces between fins 131 and 132 increase, they do so symmetrically about fin template 120. For embodiments where the spaces between fins 131 and 132 decrease, they do so symmetrically about fin template 120.

Figure 1B:
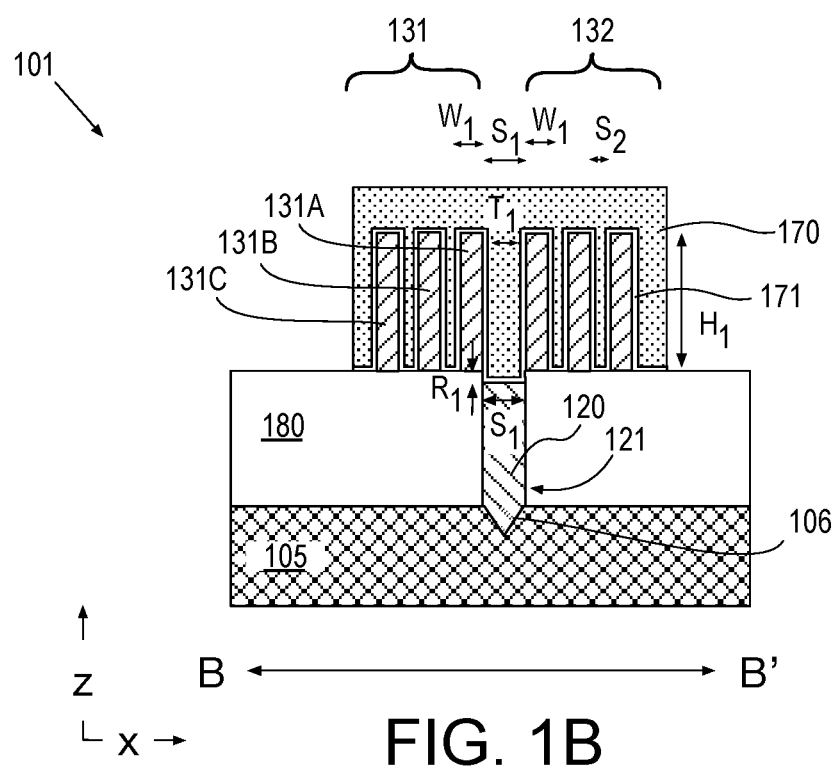
FIG. 1B is a cross-sectional view of the portion of the IC illustrated in FIG. 1A, in accordance with some embodiments.

FIG. 1B is a cross-sectional view of the portion of the IC illustrated in FIG. 1A, in accordance with some embodiments. The cross-sectional view is along the B-B' line delineated in FIG. 1A. As further shown in FIG. 1B, fins 131 and fins 132 are over a dielectric material 180, while a bottom of fin template 120 is within a fin template trench 121 and is in contact with substrate layer 105. Fin template trench 121 extends from substrate layer 105 through the entire thickness (e.g., z-dimension) of dielectric material 180. Fin template 120 is within fin template trench 121 and extends from substrate layer 105 through at least a portion of dielectric material 180 (i.e., at least partially fills fin template trench 121). In the illustrated example, bottoms of fins 131 are in contact with dielectric material 180. Likewise, bottoms of fins 132 are in contact with dielectric material 180. In some further embodiments, a top surface of fins 131 and 132 are coplanar such that fins 131 and 132 have the same fin height $H_1$ from a top surface of dielectric material 180. Fin height $H_1$ may vary with implementation, for example as a function of fin width $W_1$ (that may further be a function of channel depletion characteristics) to maintain a practical fin aspect ratio. In some examples where fin width $W_1$ is 4-9 nm, fin height $H_1$ is 10-50 nm. Dielectric material 180 may be of any composition having a relative permittivity that is suitable for electrical isolation of a transistor, such as, but not limited to, silicon oxides (e.g., $SiO_2$, or siloxane derivatives), carbon-doped oxide (SiOC (H)), silicon nitride, silicon oxynitride, or polymer dielectrics (e.g., benzocyclobutene, porous methyl silsesquioxane). Dielectric material 180 may have any suitable thickness, for example ranging from 25 nm to 150 nm, or more.

Dielectric material 180 is over substrate layer 105. Substrate layer 105 may be an epitaxial layer over an underlying bulk crystalline substrate (not depicted), or substrate layer 105 may be a top portion of a bulk crystalline substrate. In some advantageous embodiments, substrate layer 105 comprises a group IV semiconductor, such as silicon (Si), which is advantageous for both conventional silicon-channeled MOSFETs, as well as for large scale integration of non-silicon channeled transistors, including III-V channeled transistors or III-N channeled transistors. In some embodiments where substrate layer 105 comprises silicon, substrate layer 105 is monocrystalline with the crystallographic orientation being (100) such that dielectric material 180 is on a (100) surface of substrate layer 105. A substrate layer 105 comprising silicon or other cubic crystalline material may also have (111) or (110) crystallographic orientation. Other crystallographic orientations are also possible. For example, dielectric material 180 may be over a surface of substrate layer 105 that has been miscut, or offcut 2-10° toward [110]. Such crystal surfaces may facilitate nucleation of heteroepitaxial material, for example. Other crystalline substrate embodiments are also possible, with other Group IV examples including, germanium (Ge), or silicon-germanium (SiGe). Substrate layer 105 may also be other than a crystalline Group IV material, such as, but not limited to III-V compound semiconductors (e.g., GaAs or other zinc-blende crystal alloys), or silicon-carbide (SiC), or sapphire.

In some embodiments, a monocrystalline fin template occupies at least a portion of a transistor fin template trench. For example, fin template 120 may be a monocrystalline material that forms a heterojunction with substrate layer 105, or fin template 120 may be a non-planar feature of substrate layer 105. Where there is a heterojunction between fin template 120 and substrate layer 105, fin template 120 may be any of monocrystalline silicon, monocrystalline SiGe, monocrystalline III-V alloy, or monocrystalline III-N alloy. In the illustrated example, fin template 120 is in contact with a substrate crystal facet 106. Substrate crystal facet 106 may facilitate a heteroepitaxial fin template 120 having a different crystal composition than that of substrate layer 105. In some exemplary embodiments where substrate layer 105 comprises silicon (e.g., monocrystalline silicon) and fin template 120 comprises a monocrystalline SiGe, monocrystalline III-V alloy, or monocrystalline III-N alloy, the space width $S_1$ may be selected to improve crystal quality of fin template 120, for example through aspect ratio trapping (ART) within fin template trench 121.

Figure 2:
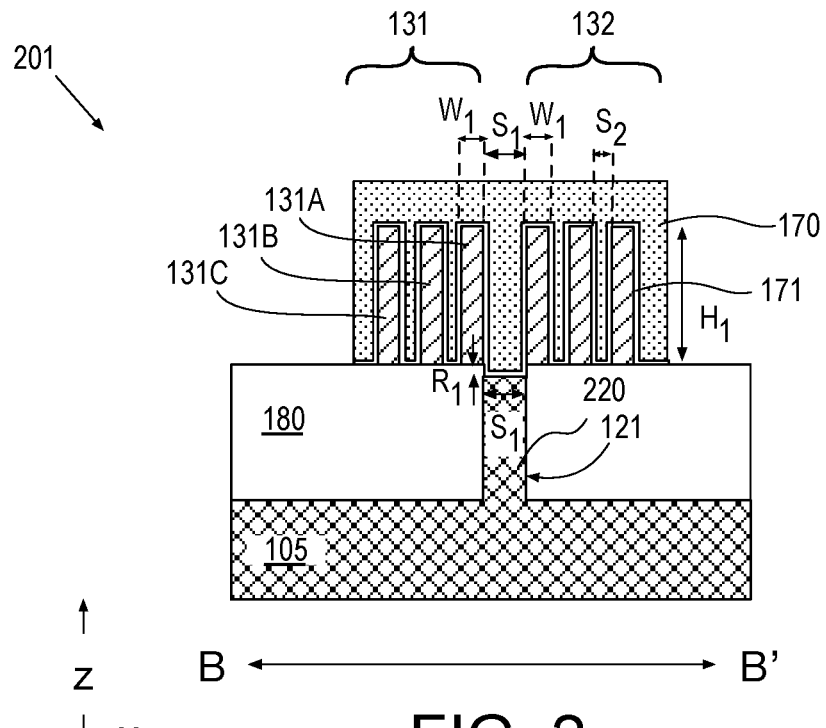
FIG. 2 and FIG. 3 are cross-sectional views of a portion of an IC including a finFET with multiple crystalline fins surrounding a fin template, in accordance with some alternative embodiments.

FIG. 2 is a cross-sectional view of a portion of an IC including a finFET 201 with multiple crystalline fins surrounding a fin template, in accordance with some alternative embodiments where a fin template 220 is a feature of substrate layer 105. Fin template 220 nevertheless resides within fin template trench 121 extending through dielectric material 180 substantially as described above for transistor 101. Because fin template 220 is a portion of substrate layer 105, there is no material interface at the base of fin template 220. In some such embodiments where substrate layer 105 comprises monocrystalline silicon, fin template 220 also comprises monocrystalline silicon. In another embodiment, where substrate layer 105 comprises a monocrystalline SiGe alloy, fin template 220 also comprises that same SiGe alloy. In still other embodiments, where substrate layer 105 is a III-V alloy, fin template 220 is that same III-V alloy. All other structures illustrated in FIG. 2 are as described for transistor 101 (FIG. 1A-1B) and therefore the same reference numbers are retained in FIG. 2.

As noted above, a fin template is within a fin template trench that extends through a dielectric material that underlies the transistor fins. As described further below, at some point in the manufacture of a multi-finned transistor the fin template is to extend above the dielectric material through which the fin template trench passes so that an exposed sidewall of the fin template may be employed to form fins over the dielectric material. In FIG. 1B, fin template 120 has been since modified through subsequent processing so that fin template 120 occupies only a portion of fin template trench 121 and extends from substrate layer 105 through only a partial thickness of dielectric material 180. Fin template 120 is recessed from a top surface of dielectric material 180 by a recess depth $R_1$, exposing a portion of the sidewall of fin template trench 121.

Figure 3:
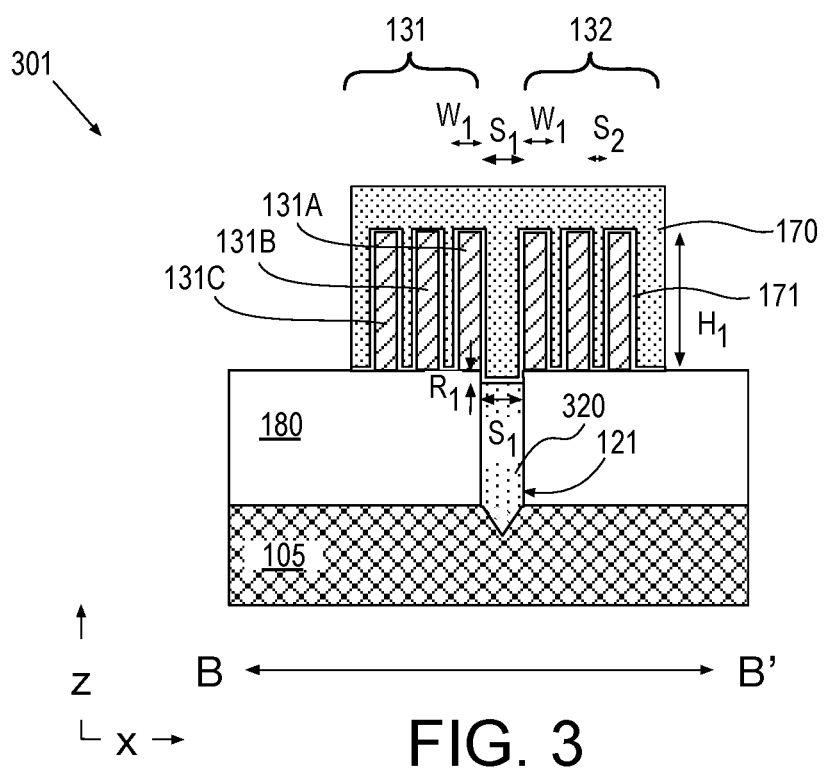

In some embodiments, one or more dielectric materials are within a fin template trench of a multi-finned transistor. Dielectric materials within a fin template trench is indicative of a fabrication process that has removed and/or replaced one or more crystalline materials of the fin template with one or more dielectric materials. For convenience, such dielectric materials are still referred to herein as the fin template for at least the reason that they are also located within the fin template trench and therefore have many of the same structural attributes. Any of the crystalline materials described above might be replaced or converted into a dielectric material, for example, which might be advantageous for further isolating a transistor from an underlying substrate layer. FIG. 3 is a cross-sectional view of a portion of an IC including a transistor 301 with multiple fins 131, 132 surrounding fin template trench 121, in accordance with some alternative embodiments. As shown, the structure of transistor 301 is substantially the same as the structure of transistor 101 (FIG. 1B). However, a fin template 320 occupying the space width $S_1$ and separating gate electrode 170 from substrate layer 105 is a dielectric material. Hence, the crystalline material described above for fin template 120 (FIG. 1B) may have been replaced with a dielectric material to generate fin template 320. Fin template 320 may be of any dielectric material(s) known to be suitable for electrical isolation of a transistor, such as any of those materials described above for dielectric material 180. In some embodiments, fin template 320 is a dielectric having a different composition than dielectric material 180. In alternative embodiments, fin template 320 is a dielectric having the same composition as dielectric material 180. Even where fin template 320 has the same composition as dielectric material 180, fin template trench 121, defining an interface between fin template 320 and dielectric material 180, may be readily decorated as a result of differences in film stress and/or other attributes associated with replacing crystalline material that previously occupied fin template trench 121.

In some embodiments, a multi-finned transistor includes fins having a material composition that is different than that of the fin template. In further reference to FIG. 1B, in some exemplary embodiments where fins 131 are the same crystalline material as fins 132, fin template 120 is of a different crystalline material. As noted above, fin template 120 may, for example, comprise a group IV crystal, such as monocrystalline silicon (Si), monocrystalline SiGe, or monocrystalline Ge. Fins 131 and 132 may then comprise a monocrystalline III-V alloy with a first sub-lattice of at least one element from group III of the periodic table (e.g., Al, Ga, In), and a second sub-lattice of at least one element of group V of the periodic table (e.g., P, As, Sb). In another embodiment where fin template 120 comprises a group IV crystal, fins 131 and 132 comprise a different group IV crystal, such as monocrystalline silicon (Si), monocrystalline SiGe, or monocrystalline Ge. For silicon fin template embodiments, fins 131 and 132 are other than monocrystalline silicon (e.g., the fins are monocrystalline SiGe or Ge). For germanium fin template embodiments, fins 131 and 132 are other than monocrystalline germanium (e.g., the fins 131 and 132 are monocrystalline Si, monocrystalline SiGe, or any other non-germanium embodiment). For SiGe fin template embodiments, fins 131 and 132 have other than the same SiGe composition as the fin template (e.g., fins 131, 132 are monocrystalline Si, monocrystalline Ge, SiGe of a different composition than the template, or any other non-Group IV material). In some other embodiments, fin template comprises a monocrystalline III-V alloy with a first sub-lattice of at least one element from group III of the periodic table (e.g., Al, Ga, In), and a second sub-lattice of at least one element of group V of the periodic table (e.g., P, As, Sb). For such III-V fin template embodiments, fins 131 and 132 are other than that same III-V material. For example, fins 131 and 132 may be monocrystalline Si, monocrystalline Ge, monocrystalline SiGe, or a different III-V material.

For embodiments where fins 131 and 132 comprise a monocrystalline III-V alloy, the alloy may be a binary, ternary, or quaternary III-V compound. For exemplary N-type transistor embodiments, fins 131 and 132 may be a III-V material having a high electron mobility, such as, but not limited to InGaAs, InP, InSb, InAs, and GaAs. For some such embodiments, fins 131 and 131 are a ternary III-V alloy, such as InGaAs or GaAsSb. For some $In_xGa_{1-x}As$ fin embodiments, In content (x) is between 0.6 and 0.9, and advantageously is at least 0.7 (e.g., $In_{0.7}Ga_{0.3}As$). In some embodiments with highest mobility, fins 131 and 132 are intrinsic material and not intentionally doped with any electrically active impurity.

In still other embodiments, fins 131 and 132 comprise a monocrystalline III-N alloy with a first sub-lattice of at least one element from group III of the periodic table (e.g., Al, Ga, In), and a second sub-lattice of nitrogen (N). For such III-N fin embodiments, the fin template is other than that same III-N material (e.g., the fin template is monocrystalline Si, Ge, SiGe, a different III-N material, etc.).

As further illustrated in FIG. 1B, gate electrode 170 is located within the spaces between fins 131 and within the spaces between fins 132. Gate electrode 170 couples to a channel region of fins 131 and fins 132 through a gate dielectric 171 that is over sidewalls of fins 131 and fins 132. Between fins 131, gate electrode 170 occupies the portion of space width $S_2$ not occupied by gate dielectric 171. Likewise, between fins 132, gate electrode 170 occupies the portion of space width $S_2$ not occupied by gate dielectric 171. Noting fin template 120 occupies space width $S_1$, gate electrode 170 occupies the portion (e.g., $T_1$) of the width $S_1$ that is not occupied by gate dielectric 171. With fin template 120 not extending above dielectric material 180, neither gate dielectric 171 nor gate electrode 170 is over a sidewall of fin template 120. Transistor 101 therefore has a current carrying width that is a function of the number of fins 131, 132 multiplied by a sidewall distance (e.g., twice the fin height $H_1$) associated with each fin.

Gate dielectric 171 may have any composition and any thickness known to be suitable for transistors having channel material for a given semiconductor composition and operable under given bias conditions. In some embodiments, gate dielectric 171 is a material having a conventional relative permittivity (e.g., k value below 9), such as, but not limited to silicon dioxide, silicon oxynitride, or silicon nitride. In some other embodiments, gate dielectric 171 is a material having a high relative permittivity (e.g., k value above 10). The high-k dielectric material may include elements such as hafnium, silicon, oxygen, titanium, tantalum, lanthanum, aluminum, zirconium, barium, strontium, yttrium, lead, scandium, niobium, and zinc. The high-k material in some embodiments is a metal oxide (e.g., comprising one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate). The high-k material in some embodiments is a metal silicate (e.g., comprising one or more of above metals, oxygen and silicon). In still other embodiments, gate dielectric 171 includes two or more dielectric material layers, such as, but not limited to, a layer with a higher relative permittivity over a layer with a lower relative permittivity. The one or more layers may include silicon oxide, silicon dioxide ($SiO_2$) and/or a high-k dielectric material.

Gate electrode 170 may likewise have any composition to be suitable for controlling the channel conductivity of a semiconductor channel. Gate electrode 170 may have any suitable work function and may include a doped semiconductor (e.g., polysilicon), or an elemental metal layer, a metal alloy layer, and/or laminate structure. The gate electrode 170 may include at least one P-type work function metal or N-type work function metal, depending on conductivity type of the transistor channel (e.g., NMOS transistors with N-type work function metal and PMOS transistors with P-type work function metal). In some implementations, the gate electrode 170 include a stack of two or more metal layers, where one or more metal layers are work function metal layers and at least one metal layer is a conductive fill layer. For PMOS transistors metals that may be used for the gate electrode 170 include, but are not limited to, ruthenium, palladium, platinum, cobalt, nickel, and conductive metal oxides (e.g., ruthenium oxide). For NMOS transistors, metals that may be used for the gate electrode 170 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide.

Transistor 101 (as well as transistors 201 and 301) may further include any source structure and any drain structure (not illustrated in FIG. 1A as being under source and drain metallization 150) known to be suitable for a multi-finned FET. For example, a source structure and a drain structure of an NMOS transistor may include a monocrystalline or polycrystalline Group IV, III-V or III-N semiconductor doped with any donor dopants to any concentration while a source structure and a drain structure of a PMOS transistor may include a semiconductor doped with any acceptor dopants to any concentration. Source and drain semiconductor structures may be raised (e.g. epitaxial growths) from ends of the fins 131 and 132, and may even merge the fins 131 and/or fins 132 together. Alternatively, source and drain semiconductor structures may simply be impurity doped ends of fins 131 and 132. Regardless of the source and drain architecture, source and drain metallization 150 couples to fins 131 and 132 through an electrical contact (e.g., ohmic, rectifying, or tunneling junction) to the source and drain semiconductor. Source and drain metallization 150 may further be of any composition known to be suitable for such purposes as embodiments herein are not limited in this respect.

Figure 4A:
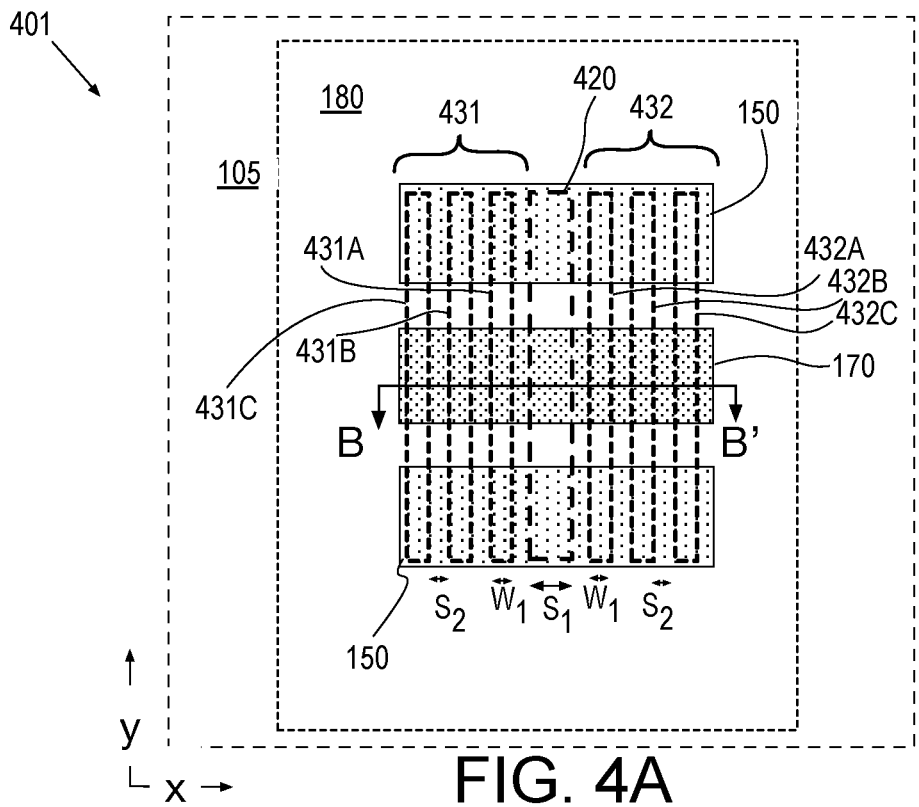
FIG. 4A is a plan view of a portion of an IC including a finFET with multiple fins surrounding a fin template, in accordance with some embodiments.
Figure 4B:
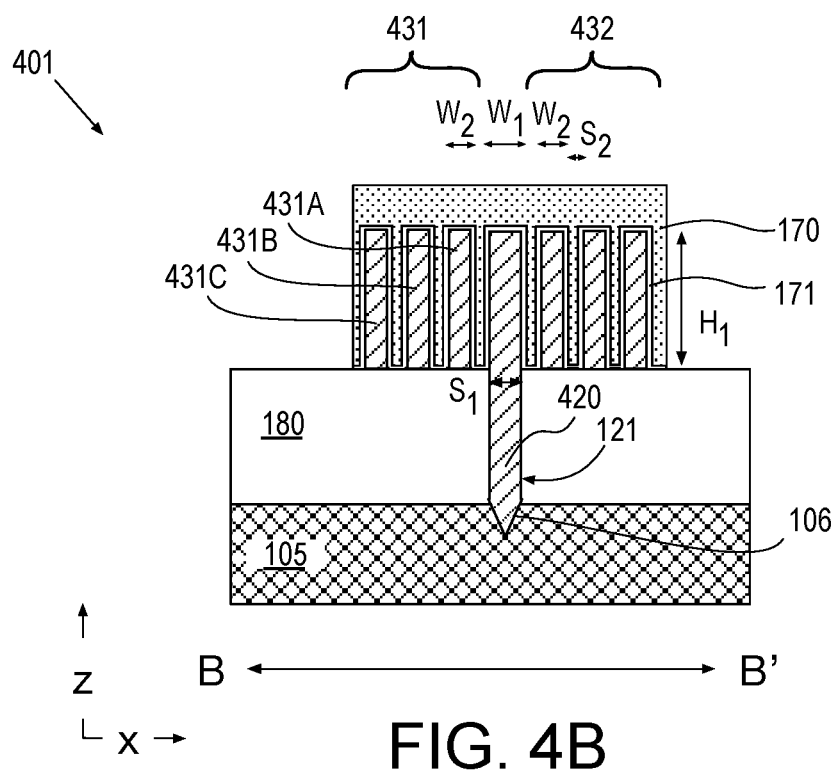
FIG. 4B is a cross-sectional view of the portion of the IC illustrated in FIG. 4A, in accordance with some embodiments.

In some alternative embodiments, a fin template retained within a transistor structure maintains a height that exceed a height of a fin template trench (i.e., the fin template height exceeds the thickness of dielectric material that is located below adjacent fins). For such embodiments, one or more of a gate dielectric or gate electrode may extend over a sidewall of the fin template in addition to extending over sidewalls of adjacent fins. FIG. 4A is a plan view of a portion of an IC including a transistor 401 with multiple fins surrounding a fin template, in accordance with some such embodiments. In FIG. 4A, dashed line is employed to illustrate salient structural interfaces that are substantially covered by one or more overlying material layer. FIG. 4B is a cross-sectional view of transistor 401 along the B-B' line also illustrated in FIG. 4A, in accordance with some embodiments.

Transistor 401 may also be an N-type (NMOS) or a P-type (PMOS) FET. In the exemplary embodiments, transistor 401 is a field effect transistor (FET) over a portion of substrate layer 105. Transistor 401 includes one or more fins 431 on a first side of a fin template 420 and one or more fins 432 on a second side of fin template 420, opposite the first. Fins 431 and 432 are also substantially parallel to each other with a shortest fin length (i.e., transverse width) being in a first dimension (e.g., x) and a longest fin length (i.e., longitudinal length) in a second dimension (e.g., y). In the illustrated example, fins 431 include a fin 431A closest to fin template 420, a fin 431C farthest from fin template 420, and a fin 431B between fins 431A and 431C. Likewise, fins 432 include a fin 432A closest to fin template 420, a fin 432C farthest from fin template 420, and a fin 432B between fins 432A and 432C. Fins 431 (e.g., A-C) and fins 432 (e.g., A-C) are advantageously substantially identical structures configured into electrical parallel for a greater current carrying capacity of transistor 401. Gate electrode 170 extends in the x-dimension over a channel region of fins 431 and fins 432. Source and drain metallization 150 also extend in the x-dimension, with an underlying source and drain coupling ends of the fins 431 and fins 432 to source and drain metallization 150.

The number of fins on one side of fin template 420 is equal to the number of fins on an opposite side of fin template 420. Hence, in the illustrated example, the number of fins 431 (e.g., three) is equal to the number of fins 432 (e.g., three). This relationship holds for any number of fins from one fin on each side of fin template 420 to an arbitrary practical maximum number of fins on each side of fin template 420.

The pitch of fins 431 and fins 432 may vary with technology node as described above for fins 131 and 132 (e.g., FIG. 1A). For example, fin width $W_1$ may again be 4-9 nm with fin space width $S_2$ also 4-9 nm. In the example illustrated in FIG. 4A, fin template 420 occupies a space width $S_1$ that is larger than space width $S_2$. In some embodiments where space width $S_2$ is 4-9 nm, fin template 420 occupies a space width $S_1$ that is larger than 9 nm. It is noted however that fin template 420 may also have the same lateral dimensions as fins 431 and 432. Fins 431A and 432A are not immediately adjacent to fin template 420, and instead are spaced apart from fin template 420 by a space (e.g., of space width $S_2$). As further illustrated in FIG. 4B, fin template 420 has a top surface that is coplanar with top surfaces of fins 431A and 432A. Fin 431A is spaced apart from fin 432A by space width $S_1$ that is occupied by fin template 420 plus twice the width of a space on either side of fin template 420. Fins 431 may have the same pitch as fins 432, however the two sets of fins 431 and 432 are separated by the intervening fin template 420.

For transistor 401, fin width and/or the width of a space between adjacent fins may also vary symmetrically about a longitudinal centerline of the transistor. In FIG. 4A, for example, the width of fins 431 may vary (increase or decrease) with distance from a centerline of fin template 420, and the width of fins 432 may vary (increase or decrease) with distance from a centerline of fin template 420 in the same manner. In the example shown in FIG. 4A, both fin 431A and fin 432A have the fin width $W_1$. Fin 431B likewise has substantially the same width as fin 432B, even if the width of fins 431B and 432B is not equal to fin width $W_1$. Fin 431C likewise has substantially the same width as fin 432C, even if the width of fins 431C and 432C is not equal to fin width $W_1$. Hence, for embodiments where the widths of fins 431 and 432 increase or decrease, they do so symmetrically about fin template 420. In the example shown in FIG. 4A, both fins 431B and 431C are spaced apart by space width $S_2$. Fins 432B and 432C are likewise spaced apart by space width $S_2$. The space between fins 431B and 431A is also substantially the same as the space between fins 432B and 432A, even if this space is not equal to space width $S_2$. Hence, for embodiments where the spaces between fins 431 and 432 increase or decrease, they do so symmetrically about fin template 420.

As further shown in FIG. 4B, a bottom of fin template 420 is within fin template trench 121 and is in contact with substrate layer 105. Fin template 420 may form a heterojunction with substrate layer 105, or fin template 420 may be a feature of substrate layer 105. Where there is a heterojunction between fin template 420 and substrate layer 105, fin template 420 may be any of monocrystalline silicon, monocrystalline SiGe, monocrystalline III-V alloy, or monocrystalline III-N alloy. In the illustrated example, fin template 420 is in contact with a substrate crystal facet 105. Substrate crystal facet 106 may facilitate growth of a heteroepitaxial fin template 420 of a different crystal composition than that of substrate layer 105. In some exemplary embodiments where substrate layer 105 comprises silicon (e.g., monocrystalline silicon) and fin template 420 comprises a monocrystalline SiGe, monocrystalline III-V alloy, or monocrystalline III-N alloy, the space width $S_1$ may be selected to improve crystal quality of fin template 420, for example through aspect ratio trapping (ART) within fin template trench 121.

Where a fin template 420 is a feature of substrate layer 105, there will be no material interface at the base of fin template 420. In some such embodiments where substrate layer 105 comprises monocrystalline silicon, fin template 420 also comprises monocrystalline silicon. In another embodiment, where substrate layer 105 comprises a monocrystalline SiGe alloy, fin template 420 also comprises that same SiGe alloy. In still other embodiments, where substrate layer 105 is a III-V alloy, fin template 420 is that same III-V alloy.

With fin template 420 extending to the fin height $H_1$, fin template 420 completely fills fin template trench 121 and extends through the entire thickness of dielectric material 180 that underlies fins 431 and 432. Unlike transistors 101, 201 and 301 where fins are of a different material composition than the fin template, in transistor 401 fins 431 and 432 may have the same composition as fin template 420. Fins 431 and 432 may be the same monocrystalline material as fin template 420. In some such embodiments, fins 431, fins 432 and fin template 420 all comprise the same group IV crystal, and may be monocrystalline silicon (Si), monocrystalline SiGe, or monocrystalline Ge, for example. Hence, for silicon fin embodiments, the fin template is also crystalline silicon. For germanium fin embodiments, the fin template also germanium. For SiGe fin embodiments, the fin template has the same SiGe composition as the fins. In some other embodiments, fins 431 and 432 comprise a monocrystalline III-V alloy with a first sub-lattice of at least one element from group III of the periodic table (e.g., Al, Ga, In), and a second sub-lattice of at least one element of group V of the periodic table (e.g., P, As, Sb). For such III-V fin embodiments, the fin template is that same III-V material. In still other embodiments, fins 431 and 432 comprise a monocrystalline III-N alloy with a first sub-lattice of at least one element from group III of the periodic table (e.g., Al, Ga, In), and a second sub-lattice of nitrogen (N). For such III-N fin embodiments, the fin template is that same III-N material (e.g., Si, Ge, SiGe, different III-N material, etc.).

As further illustrated in FIG. 4B, gate electrode 170 is located within the spaces between fins 431 and within the spaces between fins 432. Gate electrode 170 couples to a channel region of fins 431 and fins 432 through gate dielectric 171 that is over sidewalls of fins 431, sidewalls of fins 432 and a sidewall of fin template 420. Between fins 431, gate electrode 170 occupies the portion of space width $S_2$ not occupied by gate dielectric 171. Likewise, between fins 432, gate electrode 170 occupies the portion of space width $S_2$ not occupied by gate dielectric 171. With fin template 420 extending above dielectric material 180, gate dielectric 171 and gate electrode 170 are also over a sidewall of fin template 420. Transistor 401 therefore has a current carrying width that is a function of the number of fins 431, 432 summed with fin template 420 and multiplied by a sidewall distance (e.g., twice the fin height $H_1$) associated with each fin and the fin template. Although fin template 420 remains directly coupled to substrate layer 105, isolation of transistor 401 is greatly improved because there is no such direct coupling between substrate layer 105 fins 431 and 432. The leakage contribution attributable to fin template 420 scales down as the number of fins 431 and 432 increases.

Gate dielectric 171 may have any composition and any thickness known to be suitable for transistors having channel material for a given semiconductor composition and operable under given bias conditions. Gate electrode 170 may likewise have any composition known to be suitable for controlling the channel conductivity of a semiconductor channel. Gate dielectric 171 and gate electrode 170 may have any of the compositions described above in the context of transistor 101, for example. Transistor 401 may further include any source structure and any drain structure known to be suitable for a multi-finned FET. For example, a source structure and a drain structure of an NMOS transistor may include a semiconductor doped with any donor dopants to any concentration while a source structure and a drain structure of a PMOS transistor may include a semiconductor doped with any acceptor dopants to any concentration. Source and drain semiconductor structures may be raised (e.g. epitaxial growths) from ends of the fins 431 and 432, and may even merge the fins 431 and/or fins 432 together. Alternatively, source and drain semiconductor structures may simply be impurity doped ends of fins 431 and 432. Regardless of the source and drain architecture, source and drain metallization 150 couples to fins 431 and 432 through an electrically contact (e.g., ohmic, rectifying, or tunneling junction) to the source and drain semiconductor. Source and drain metallization 150 may further be of any composition known to be suitable for such purposes as embodiments herein are not limited in this respect.

Figure 5:
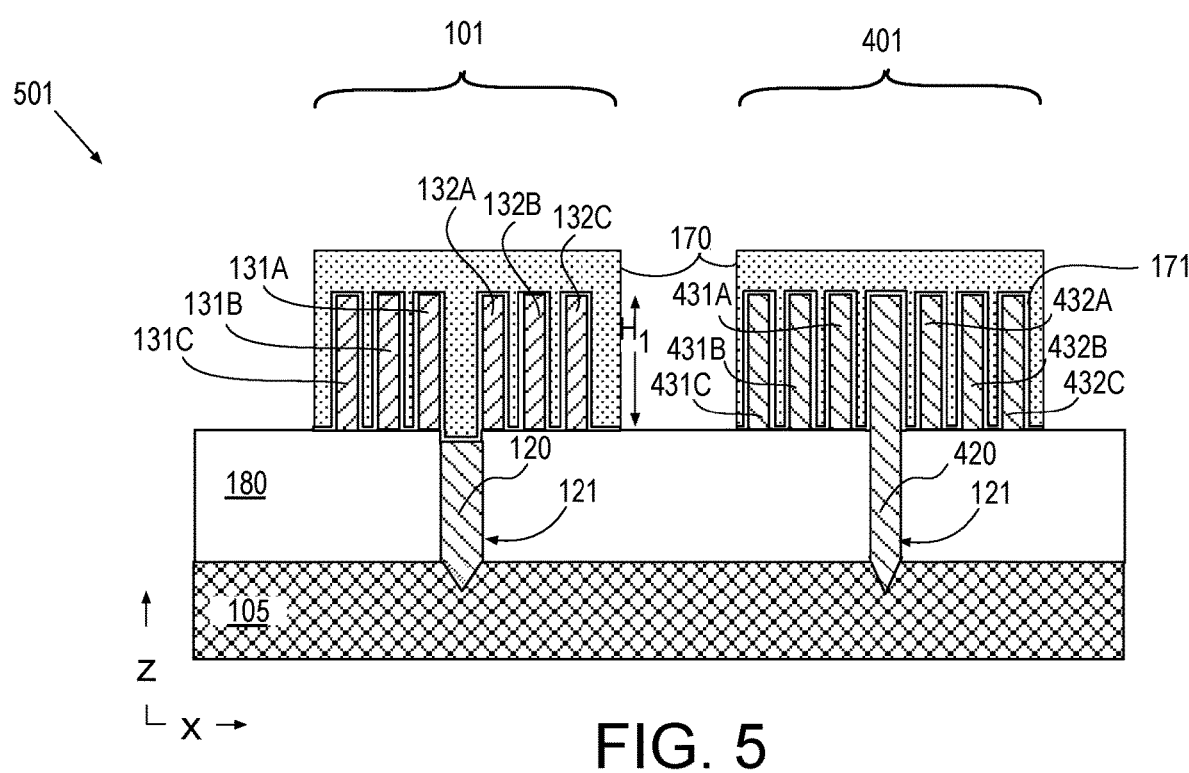
FIG. 5 is a cross-sectional view of a portion of an IC including both the finFET illustrated in FIG. 1A and the finFET illustrated in FIG. 4A, in accordance with some embodiments.

Two of more of the different types of multi-finned transistors described above may be combined within a single IC. For example, a first of the multi-finned transistors having one or more of the features described above may be suitable as an NMOS transistor while a second of the multi-finned transistors having one or more of the features described above may be suitable as an PMOS transistor with the single IC then being a CMOS IC including a plurality of such transistors. FIG. 5 is a cross-sectional view of a portion of an IC 501 including transistor 101 (illustrated in FIG. 1A) and transistor 401 (illustrated in FIG. 4A), in accordance with some embodiments. In this example, transistor 401 is the structural and/or electrical complement of transistor 101. For example, transistor 101 has fin template 120, which defines a space between fins 131A and 132A while transistor 401 has fin template 420, which is operable as an additional fin between fins 431 and 432.

For some exemplary embodiments, the composition of fin template 120 and fin template 420 is the same. For example, fin template 120 and fin template 420 may both be monocrystalline Si, monocrystalline Ge, or a monocrystalline SiGe alloy. In other embodiments, fin template 120 and fin template 420 are both any of the other crystalline materials described above as being suitable for both fin template 120 and fin template 420 (e.g., a III-V alloy, a III-N alloy). In some further embodiments fins 431 and 432 have the same composition as fin template 420. As one example, fin template 120, fin template 420, fins 431 and fins 432 may all be monocrystalline Si, monocrystalline Ge, a same monocrystalline SiGe alloy, a same III-V alloy, or a same III-N alloy. For transistor 101 however, fins 131 and fins 132 are of a different crystalline material than fin template 120 (and therefore different from fin template 420, fins 431 and fins 432). In some exemplary embodiments where fin template 120, fin template 420, fins 431 and fins 432 are monocrystalline Si (having any impurities), fins 131 and fins 132 are Ge, SiGe, a III-V alloy or a III-N alloy. In some other embodiments where fin template 120, fin template 420, fins 431 and fins 432 are all monocrystalline Ge (having any impurities), fins 131 and fins 132 are Si, SiGe, a III-V alloy or a III-N alloy. In one specific example, fin template 120, fin template 420, fins 431 and fins 432 are all Ge. Transistor 401 may in this embodiment be a PMOS device while transistor 101 may be an NMOS device with fins 131 and fins 132 being GaAs.

In some other embodiments where fin template 120, fin template 420, fins 431 and fins 432 are all a first SiGe alloy (having any impurities), fins 131 and fins 132 are Si, Ge, a second SiGe alloy, a III-V alloy or a III-N alloy. In some other embodiments where fin template 120, fin template 420, fins 431 and fins 432 are all a III-V alloy (having any impurities), fins 131 and fins 132 are Si, Ge, SiGe, a second III-V alloy, or a III-N alloy. In some other embodiments where fin template 120, fin template 420, fins 431 and fins 432 are all a III-N alloy (having any impurities), fins 131 and fins 132 are Si, Ge, SiGe, or a III-V alloy.

In some advantageous embodiments, the conductivity type of transistor 401 is complementary to the conductivity type of transistor 101. For examples, transistor 101 may be an NMOS transistor or PMOS transistor, while transistor 401 is a PMOS transistor or NMOS transistor, respectively. In some embodiments where fin template 120, fin template 420, fins 431 and fins 432 are monocrystalline Si, while fins 131 and fins 132 are SiGe, transistor 101 is a PMOS transistor and transistor 401 is an NMOS transistor. In some alternative embodiments wherein fin template 120, fin template 420, fins 431 and fins 432 are all a III-V alloy, while fins 131 and fins 132 are Si, transistor 101 is a PMOS transistor and transistor 401 is an NMOS transistor. Hence, by incorporating fins of different semiconductor composition, similar multi-finned transistor structures may be combined to implement a CMOS IC. The source and drain semiconductor employed in transistors 101 and 401 may therefore vary widely as a function of the both the composition of the fins 131, 132, 431 and 431, as well as the conductivity type of the transistor. Likewise, gate electrode 170 and gate dielectric 171 for transistor 101 may be different than for transistor 401. However, the gate electrode and gate dielectric materials are not required to be different between the two transistors 101 and 401. For example, any of the gate dielectric compositions described above in the context of transistor 101 may also be used for transistor 401, and any of the gate electrode compositions described above in the context of transistor 101 may also be used for transistor 401. The threshold voltages for the two transistors may then either be allowed to differ or the composition of fins 131, 132 may be modulated relative to the composition fin 431 and 431 to tune the threshold voltage for each when a single gate stack (dielectric and electrode) is employed for both transistors.

Figure 6:
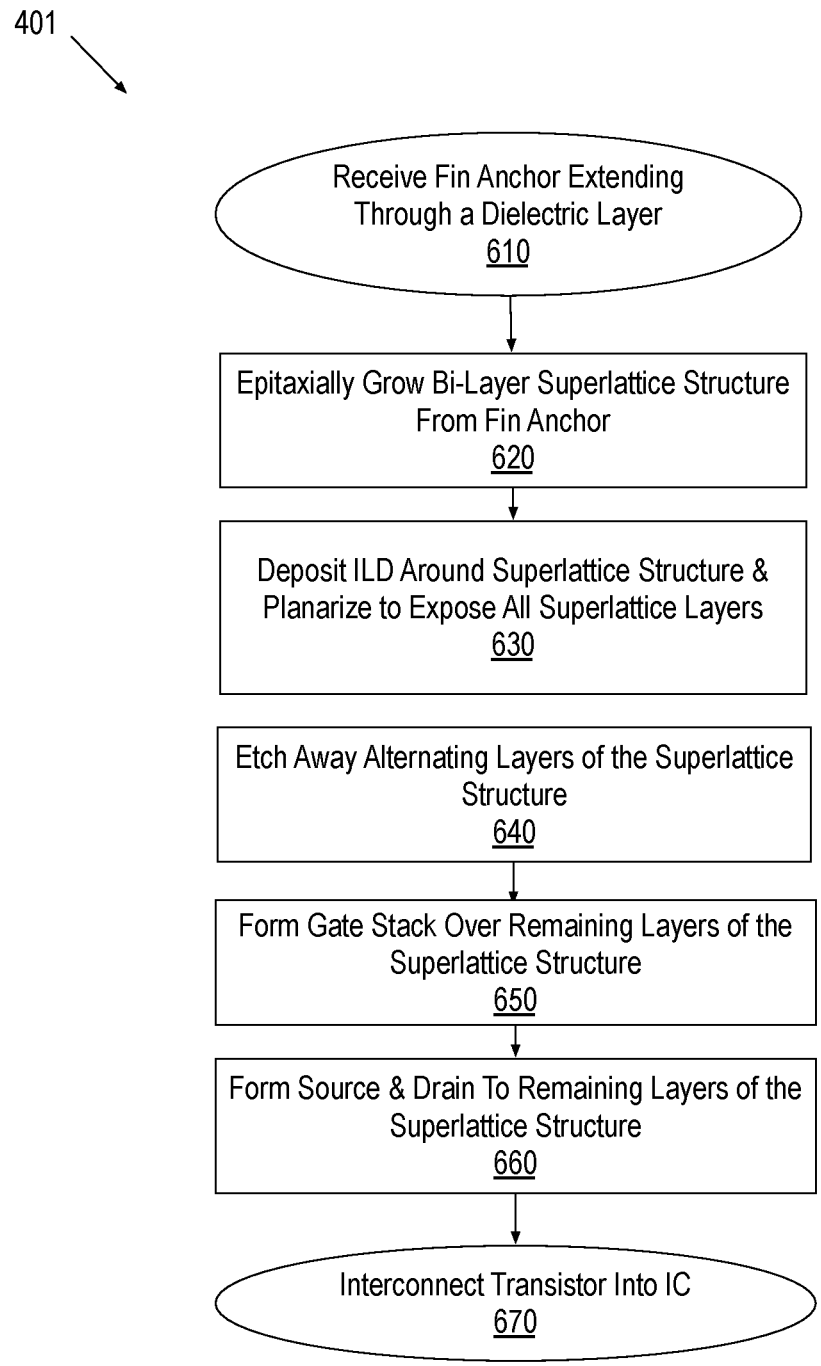
FIG. 6 is a flow diagram illustrating a method of fabricating a finFET with multiple fins by lateral epitaxial overgrowth from a fin template, in accordance with some embodiments.

A number of methods may be employed to fabricate the transistor structures described in the context FIG. 1A-FIG. 5. FIG. 6 is a flow diagram illustrating exemplary methods 600 for fabricating one or more of the transistors described above. In some embodiments, the multi-finned transistor 101 is fabricated according to methods 600. In some other embodiments, the multi-finned transistor 401 is fabricated according to methods 600. In still other embodiments, both the multi-finned transistor 101 and multi-finned transistor 401 are fabricated according to methods 600. In methods 600, a fin template is employed to epitaxially grow a superlattice structure laterally, for example with a sidewall of the template functioning as a fin fabrication mandrel, anchor, or crystal conduit that passes through the dielectric material that is adjacent to the fin template. Layers of the superlattice structure are then selectively etched to generate the fins of a multi-finned transistor. Methods 600 are further described below in the context of FIG. 7-14, which illustrate views of an exemplary transistor evolving as operations in the methods 600 are practiced, in accordance with some embodiments.

Referring first to FIG. 6, methods 600 begin at operation 610 where a workpiece is received. The workpiece may be any known to be suitable for subsequent processing. In some exemplary embodiments, the workpiece is any known to be suitable for IC manufacture. In some such embodiments, the workpiece received at operation 610 includes a crystalline semiconductor substrate, such as but not limited to, a crystalline silicon wafer. The workpiece received at operation 610 includes a fin template within a fin trench that extends through a surrounding dielectric layer. Such a fin template may be fabricated with any techniques and processes known to be suitable for fabricating a fin structure in a semiconductor material. For example, any techniques known to be suitable for fabricating a silicon fin from a bulk silicon substrate may be employed to generate a workpiece suitable for receipt at operation 610.

Figure 7:
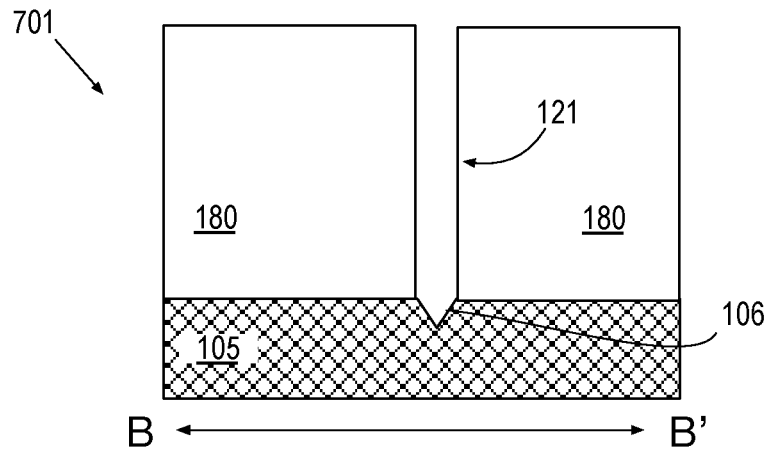
FIGS. 7, 8, 9, and 10A are cross-sectional views of a finFET structure with multiple fins evolving as the method illustrated in FIG. 6 is performed, in accordance with some embodiments.
Figure 8:
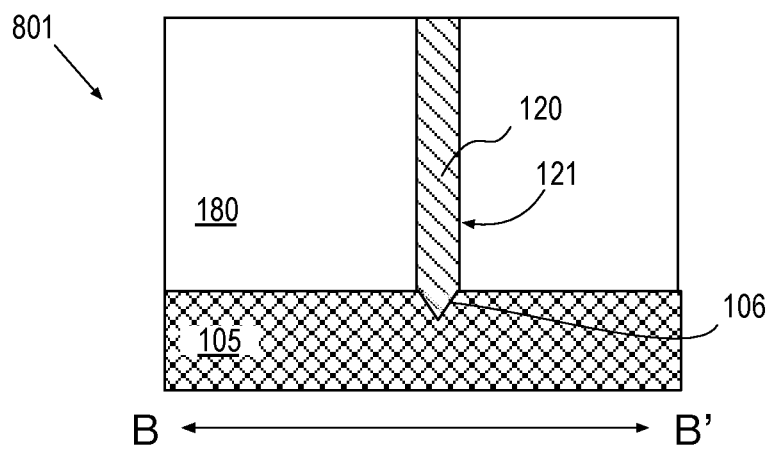
Figure 9:
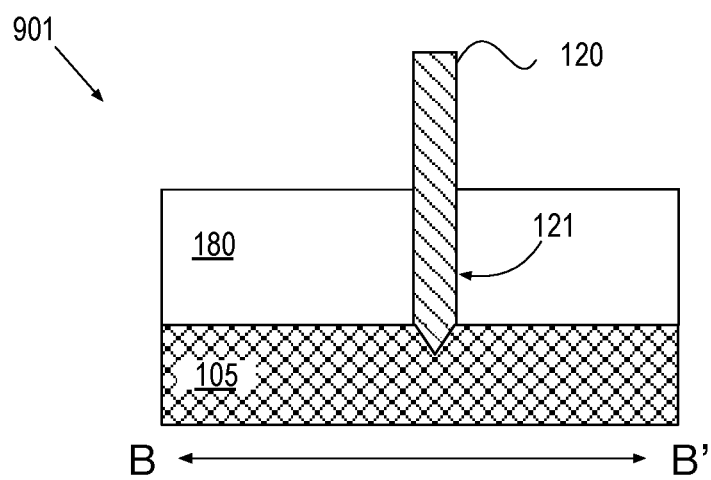

FIG. 7-9 illustrate an exemplary workpiece including a heteroepitaxial fin template evolving through a processing sequence, in accordance with some illustrative embodiments. In FIG. 7, structure 701 is illustrated along the B-B' line also visible in FIG. 1A. Structure 701 includes dielectric material 180 over substrate layer 105. The fin template trench 121 is been etched into dielectric material 180 to expose a portion of substrate layer 105. In the exemplary embodiment illustrated, fin template trench 121 has been anistropically etched. Although dimensions of fin template trench 121 may vary, the aspect ratio (z-depth:y-dimension) is advantageously at least 2:1 and more advantageously 3:1, or more for embodiments where the fin template is to have different lattice constituents than substrate layer 105. In some such embodiments, fin template trench 121 has a CD of between 10 and 200 nm. However, the z-thickness and CD may be scaled as needed to maintain a workable aspect ratio for a predetermined fin template height. A crystallographic etchant may be employed to recess a portion of substrate layer 105 and expose a suitable crystal facet 106 (e.g., a (111) plane of a silicon substrate layer having (100) crystallinity). In the illustrated example, a recess with positively sloped sidewalls is etched into substrate layer 105, which may further enhance trapping of crystalline defects (e.g., dislocations) in a subsequently grown crystalline fin template.

The patterning of fin template trench 121 may be based on any suitable lithographic patterning and thin film processing techniques. For example, one or more lithographic processes (e.g., extreme UV) and/or subtractive processes (e.g., hardmask etching) and/or additive processes (e.g., thin film deposition) may have been practiced upstream to generate trench mask structures. In some embodiments, the trench mask structures are generated by a multi-patterning process, such as, but not limited to, pitch-quartering. Such techniques may achieve a target minimum lateral width of 10-40 nm, for example. Exemplary pitch-splitting techniques include pitch halving (P/2), or pitch quartering (P/4) hardmask patterning techniques, either of which may be employed to pattern a first mask layer. Some exemplary embodiments employ one-dimensional (1D) grating mask structures to form the trench mask. Such a grating mask is advantageously amenable to both direct patterning and pitch-splitting techniques (e.g., P/2 and P/4 patterning techniques).

As further shown in FIG. 8, structure 801 includes structure 701 and fin template 120 that has been epitaxially grown from the substrate surface exposed at the bottom of fin template trench 121. Any epitaxial growth technique, such as, but not limited to, metal-organic chemical vapor deposition (MOCVD), molecular beam epitaxy (MBE), or hydride vapor phase epitaxy (HVPE) may be utilized completely back fill trench with fin template 120. Any overburden of the epitaxial growth may then be planarized with a top surface of dielectric material 180 through the practice of any planarization process known to be suitable for the materials. As further illustrated in FIG. 9, structure 901 includes structure 801 less an amount of dielectric material 180 that has been recessed etched, for example with an anisotropic or isotropic (dry or wet) etch process that is selective to dielectric material 180 over fin template 120. The recess etch may be ended, for example, when the exposed sidewall of fin template 120 achieves a predetermined height. A workpiece including structure 901 may be input to methods 600, for example.

Returning to FIG. 6, methods 601 continue at operation 620 where a superlattice structure is grown on at least an exposed sidewall of a fin template. Any epitaxial growth technique, such as, but not limited to, MOCVD, MBE, or HVPE may be utilized to selectively grow the superlattice structure at operation 620. While the superlattice structure grown at operation 620 may include any number of compositionally distinct layers with any duty cycle, in some advantageous embodiments that facilitate a highest density of fin structures, the superlattice structure grown at operation 620 includes a plurality of bi-layers. Each bi-layer includes a first layer that is to be retained as a fin, and a second layer that is to be selectively removed from the first layer as a means of separating the first layer from adjacent first layers of additional bi-layers included in the superlattice. In the example further illustrated in FIG. 10A, structure 1001 includes structure 901 with a superlattice structure 1002 over fin template 120. FIG. 10B is a plan view of the finFET structure 1001, in accordance with some embodiments. As illustrated, superlattice structure 1002 expands laterally around the perimeter of fin template 120. Each of the bi-layers 1005, 1010, 1015 is a continuous annulus surrounding fin template 120.

Figure 10A:
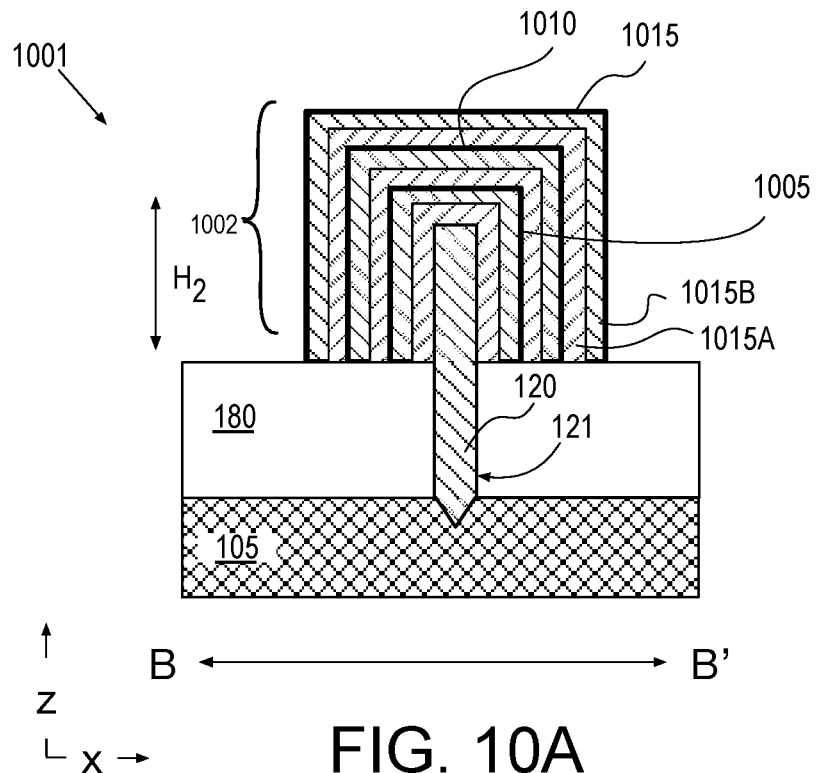
Figure 10B:
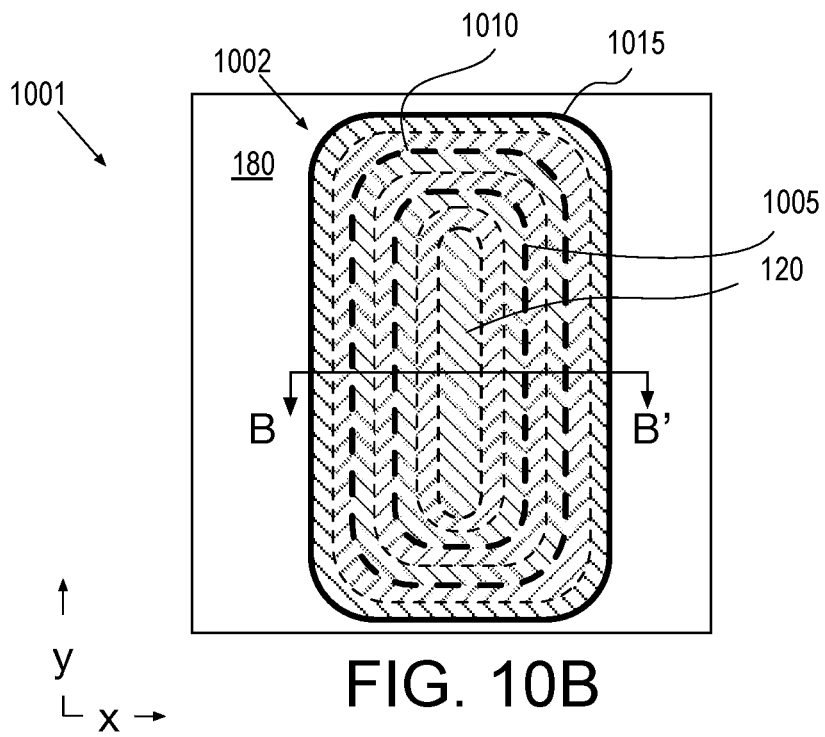
FIG. 10B is a plan view of the finFET structure shown in FIG. 10A, in accordance with some embodiments.
Figure 11:
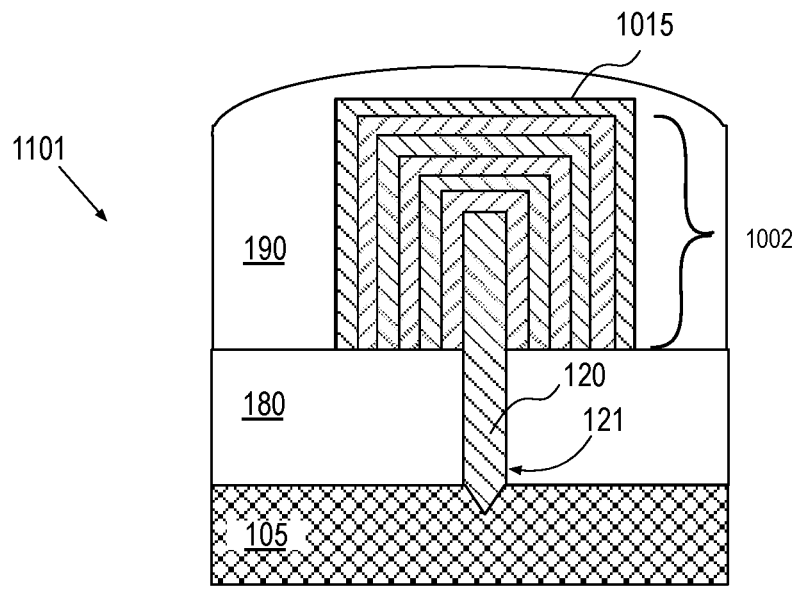
FIGS. 11, 12, 13 and 14 are cross-sectional views of a finFET structure with multiple fins evolving as the method illustrated in FIG. 6 is performed, in accordance with some embodiments.

As further shown in FIGS. 10A and 10B, superlattice structure 1002 includes a plurality of bi-layers with boundaries 1005, 1010, and 1015 between adjacent bi-layers highlighted with a thick line in FIG. 10A merely for the sake of clarity. Each bi-layer includes two crystalline material layers (e.g., 1015A and 1015B) of different composition. As described further below, the compositional differences between layers of the superlattice are to at least facilitate etch selectivity (e.g., between the two layers of a bi-layer). As also described further below, compositional differences between layers of the superlattice may also facilitate complementary transistor carrier types, for example with a first layer of the bi-layer being well suited for electron transport and a second layer of the bi-layer being well suited for hole transport.

Superlattice structure 1002 may have an arbitrary number of bi-layers with the individual layers having any thickness suitable for a gated-fin. As shown in FIG. 10A, because superlattice structure 1002 grows from a seeding sidewall of fin template 120, superlattice structure 1002 is dependent upon the crystallinity of fin template 120 as it grows laterally over dielectric material 180. The grown thickness defines a lateral width of each epitaxial layer. Epitaxial growth processes are readily controllable to form layers of 1-2 nanometers in thickness. Epitaxial growth process may also maintain atomic-level smoothness as crystalline planes advance from the sidewall of fin template 120. In some exemplary embodiments, each epitaxial layer is grown to a thickness no more than 12 nm, and may be as little as 4 nm-9 nm. Alternating ones of the epitaxial layers that are to be retained in a final transistor structure may be grown to slightly greater thickness than the intervening epitaxial layers. The alternating layers that are to be retained may be grown thicker than a desired fin width allowing for a few nanometers to be removed from the sidewall of a fin to arrive at a target fin thickness from the epitaxial layer. Such a sidewall etch may be advantageous for removing any contamination that may be occur at the interface of the bilayers during the superlattice growth.

Noting that the height by which each epitaxial layer extends from the underlying dielectric material 180 is only a function of the height of fin template 120, the epitaxial growth thickness is decoupled from fin height. For example, superlattice structure 1002 may have a minimum height $H_2$ that ranges anywhere from 10 nm to 100 nm, or more. While such heights are well beyond the critical thickness for many lattice mismatched material layers, the amount of lattice mismatch that can be accommodated between layers of the superlattice are not a function of this height, but rather a function of the layer thickness as measure perpendicular to a sidewall of fin template 120. Hence, as long as the thickness of the superlattice layers in a bi-layer does not exceed the associated critical thickness, (pseudomorphic) monocrystallinty can be maintained over an arbitrary number of bi-layers. In some exemplary embodiments where the epitaxial layer thickness is approximately 4 nm, a lattice mismatch of approximately 4% between layers of a bi-layer may be accommodated without suffering any defects associated with relaxation.

In some exemplary embodiments, each bi-layer of superlattice structure 1002 includes a layer (e.g. layer 1015A) of monocrystalline silicon and a layer (e.g., layer 1015B) of a monocrystalline SiGe alloy. In some further embodiments, the composition of the SiGe alloy is such that the alloy has a lattice mismatch of at least 1% with silicon. In some of these Si/SiGe superlattice embodiments, fin template 120 is silicon. In some alternative Si/SiGe superlattice embodiments, fin template 120 has the same composition as the SiGe alloy that is grown as part of the superlattice. In some other exemplary embodiments, each bi-layer of superlattice structure 1002 includes a layer (e.g. layer 1015A) of monocrystalline Ge and a layer (e.g., layer 1015B) of a monocrystalline SiGe alloy. In some further embodiments, the composition of the SiGe alloy is such that the alloy has a lattice mismatch of at least 1% with germanium. In some of these Ge/SiGe superlattice embodiments, fin template 120 is germanium. In some alternative Ge/SiGe superlattice embodiments, fin template 120 has the same composition as the SiGe alloy that is grown as part of the superlattice.

In some other exemplary embodiments, each bi-layer of superlattice structure 1002 includes a layer (e.g. layer 1015A) of monocrystalline Group IV material and a layer (e.g., layer 1015B) of a monocrystalline Group III-V material. Such embodiments have the advantage of very large etch selectivity differences between Group IV semiconductors and Group III-V semiconductors. In some further embodiments, the composition of Group IV material and III-V material is such that there is lattice mismatch of at least 1% between layers of the bilayer. Some III-V materials have a close lattice match to some group IV materials, allowing superlattice structure 1002 to alternate between Group IV and Group III-V semiconductor materials. In one exemplary embodiment, each bi-layer of superlattice structure 1002 includes a Ge and a GaAs layer. Ge has a good lattice match to GaAs, and the Ge layer could be subsequently employed in a fin channel (e.g., PMOS) while the GaAs layer could be sacrificial. The GaAs layer could alternatively (or additionally) be subsequently employed in a fin channel (e.g., NMOS) while the Ge layer could be sacrificial.

In some other exemplary embodiments, each bi-layer of superlattice structure 1002 includes a layer (e.g. layer 1015A) of a first monocrystalline III-V alloy and a layer (e.g., layer 1015B) of a second monocrystalline III-V alloy. In some further embodiments, the composition of the two III-V alloys is such that there is lattice mismatch of at least 1% between layers of the bilayer. In some of these III-V/III-V superlattice embodiments, fin template 120 has the same composition as one of the III-V alloys grown as part of the superlattice. In some other exemplary embodiments, each bi-layer of superlattice structure 1002 includes a layer (e.g. layer 1015A) of a first monocrystalline III-N alloy and a layer (e.g., layer 1015B) of a second monocrystalline III-N alloy. In some further embodiments, the composition of the two III-N alloys is such that there is lattice mismatch of at least 1% between layers of the bilayer. In some of these III-N/III-N superlattice embodiments, fin template 120 has the same composition as one of the III-N alloys grown as part of the superlattice.

Figure 12:
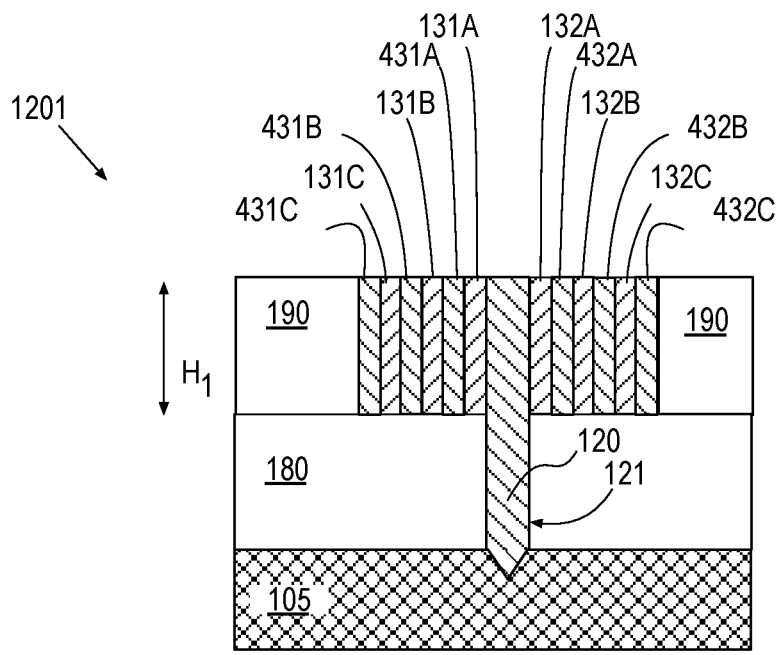
Figure 13:
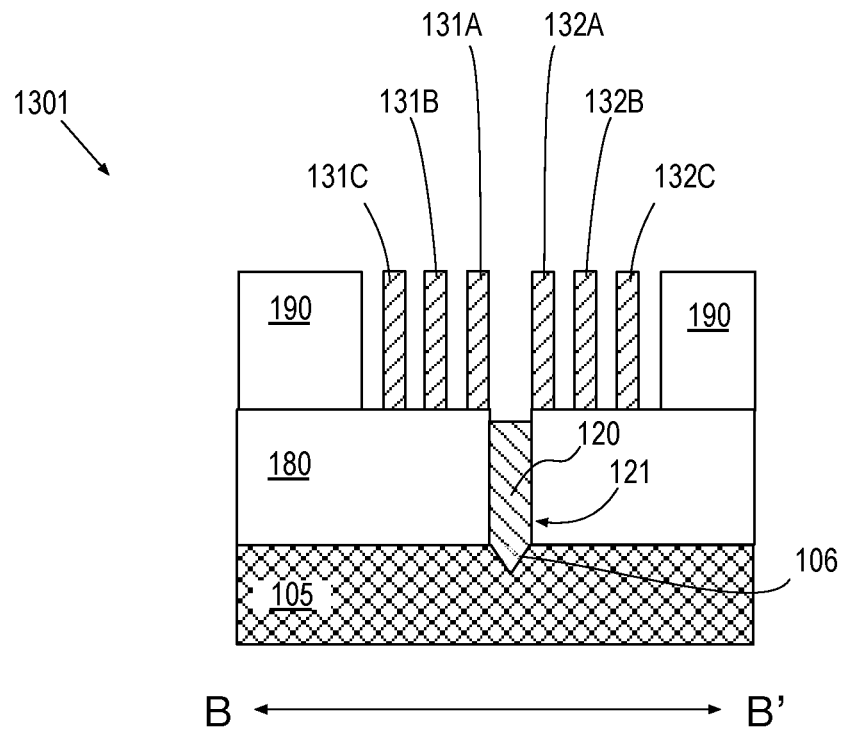

Returning to FIG. 6, methods 600 continue at operation 630 where a dielectric material is deposited over and around the superlattice structure that was formed at operation 620. The superlattice structure and the surrounding dielectric material is then planarized back, for example with any suitable chemical mechanical planarization process, to expose the fin template as well as individual layers of the superlattice. In the example further illustrated in FIG. 11, structure 1101 includes structure 1001 with the addition of dielectric material 190. dielectric material 190 may be any dielectric material suitable for the purpose of encapsulating and/or planarizing topographic features similar to superlattice structure 1002. In some exemplary embodiments, dielectric material 190 is a flowable oxide. Dielectric material 190 may be deposited with any technique suitable for the material, such as, but not limited to spin-on processes, or chemical vapor deposition (CVD). In the example further illustrated in FIG. 12, the structure 1201 includes structure 1101 following planarization. As shown, tops of individual bi-layers of superlattice structure 1002 have been polished back at least until a top of fin template 120 is exposed. At this point, superlattice structure 1002 has the height $H_1$. If desired, any suitable patterning process may then be performed to bifurcate the annular superlattice layers into separate layers on two sides of fin template 120. For example, portions of superlattice structure 1002 wrapping around ends of fin template 120 may be removed to leave substantially parallel epitaxial layer segments on opposite sides of fin template 120. Alternatively, the superlattice layers may be left annular with a source and drain formed over segments of the annular rings and a gate stack formed there between. Regardless, because the superlattice layers were originally grown as a continuous "shell" around fin template 120, segments of each layer on opposite sides of fin template 120 have the same composition and thickness. As shown in FIG. 12, on one side of fin template 120 are fins 131A-131C, which are separated from each other by intervening fins 431A-431C. On the other side of fin template 120 are fins 132A-132C, which are separated from each other by intervening fins 432A-432C.

Returning to FIG. 6, methods 600 continue at operation 640 where alternating ones of the layers in the superlattice are removed selectively to the other layers of the superlattice. An etch selective to the composition of the superlattice layer targeted for removal may be employed at operation 640 to leave free standing fins having the composition of the superlattice layer that survives operation 640. Depending on the composition of the fin template, this etch may also recess or remove some portion of the fin template. In the example further illustrated in FIG. 13, fins 431A-431C and 432A-432C are removed, for example with an isotropic or anisotropic (wet or dry) etch process that retains fins 131A-131C and 132A-132C. Fin template 120 is also reduced from fin height $H_1$ to some lesser height that is recessed within fin template trench 121 (i.e., below a top surface of dielectric material 180). In alternative embodiments, fins 131A-131C and 132A-132C are removed, for example with an isotropic or anisotropic (wet or dry) etch process that retains fins 431A-431C and 432A-432C. For such embodiments, fin template 420 (having the same composition as fins 431, 432) may retain fin height $H_1$. In some further embodiments, within one region of a substrate fins 431A-431C and 432A-432C are removed, for example with a first isotropic or anisotropic (wet or dry) etch process that retains fins 131A-131C and 132A-132C, and within another region of the substrate, fins 131A-131C and 132A-132C are removed, for example with a first isotropic or anisotropic (wet or dry) etch process that retains fins 431A-431C and 432A-432C. Operation 640 may therefore generate two sets of transistors having fins of different composition, for example as described above for IC portion 501 (FIG. 5). Optionally, where fin template 120 has been significantly recessed (or even completely removed from fin template trench 121) another dielectric material may be deposited over the retained fins, backfilling fin template trench 121. This additional dielectric material may then be etched back selectively to re-expose the fin sidewalls. As another option, the retained fin material following the selective etches described above is etched (e.g., isotropically) briefly (e.g., removing 1-2 nm from the sidewall of each fin). This optional fin etch may be employed to further tune the width of the retained fins and/or to remove any contaminants on the fin sidewalls generated during the superlattice growth.

Returning to FIG. 6, methods 600 continue at operation 650 where a gate stack (including a gate dielectric and a gate electrode) is formed over the layers of the superlattice structure (and fin template) that survived operation 640. At operation 660, a source and drain coupled to each of the remaining layers of the superlattice structure are also formed. Operations 650 and 660 may be performed in any order, and with any techniques known to be suitable for forming finFETs upon fin structures. For example, a gate-first or gate-last finFET process may be employed to complete operations 650 and 660.

Figure 14:
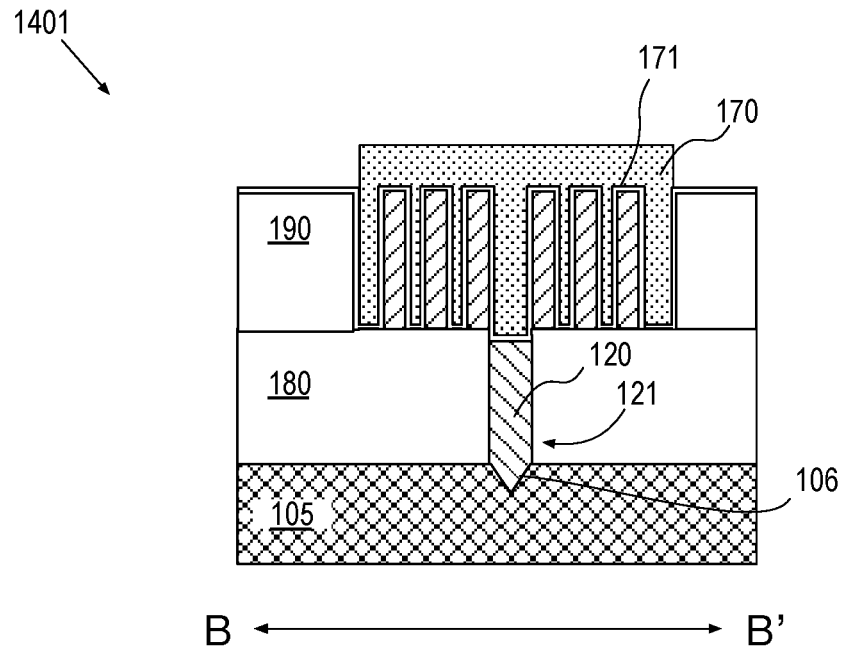

For the exemplary structure 1401 illustrated in FIG. 14, a gate stack including gate electrode 170 and gate dielectric 171 is formed over fins 131 and 132. With fin template 120 recessed, the gate stack only contact a top surface of fin template 120. The gate stack may be formed according to any known finFET fabrication technique(s). For example a sacrificial gate may be replaced with a permanent gate stack according to any "gate-last" technique. Although illustrated as a double-gate transistor or tri-gate transistor, the gate stack is at least coupled to a sidewall of fins 131 and 132. Wrap-around or "gate all-around" techniques may also be employed to fabricate a nanoribbon or nanowire transistor according to any suitable technique. Source and drain terminals (not depicted) may be formed on opposite sides of gate electrode 170. Gate electrode 170 and the source and drain terminals are then operable as a transistor based on electric field modulation of conductivity within a channel portion of fins 131-132.

In some implementations, a pair of sidewall spacers may be formed on opposing sides of the gate stacks. The sidewall spacers may separate the gate stack from the source and drain terminals. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. Source and drain terminals may be formed using either an implantation/diffusion process or etching/deposition processes. For example, dopants such as boron, aluminum, antimony, phosphorous, or arsenic may be ion-implanted into fins 131, 132 to form the source and drain terminals. Alternatively, ends of fins 131, 132 may be first etched to form recesses and an epitaxial growth process may fill the recesses with source and drain semiconductor.

Methods 600 then complete at operation 670 where individual transistors are interconnected into an IC, for example with one or more levels of metallization that couples to the gate electrode of the gate stack formed at operation 650, or couples to the source and drain formed at operation 660.

Figure 15:
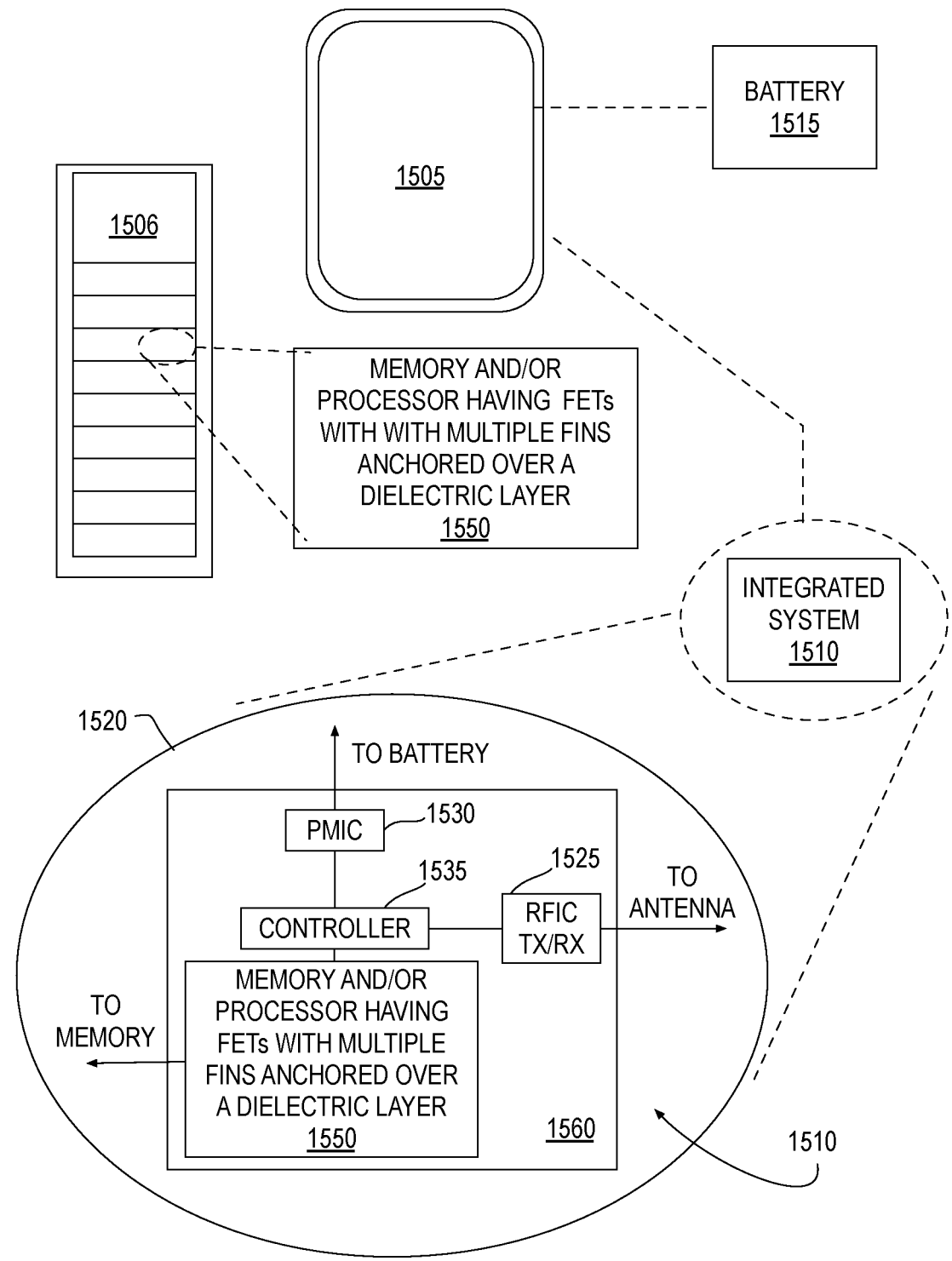
FIG. 15 illustrates a mobile computing platform and a data server machine employing an SoC including a finFET with multiple fins surrounding a fin template, in accordance with embodiments of the present invention.

FIG. 15 illustrates a mobile computing platform and a data server machine employing an IC, for example including multi-finned transistors having fins anchored over a dielectric material, in accordance with embodiments described herein. The server machine 1506 may be any commercial server, for example including any number of high-performance computing platforms disposed within a rack and networked together for electronic data processing, which in the exemplary embodiment includes a packaged monolithic SoC 1550. The mobile computing platform 1505 may be any portable device configured for each of electronic data display, electronic data processing, wireless electronic data transmission, or the like. For example, the mobile computing platform 1505 may be any of a tablet, a smart phone, laptop computer, etc., and may include a display screen (e.g., a capacitive, inductive, resistive, or optical touchscreen), a chip-level or package-level integrated system 1510, and a battery 1515.

Either disposed within the integrated system 1510 illustrated in the expanded view 1520, or as a stand-alone packaged chip within the server machine 1506, monolithic SoC 1550 includes a memory circuitry block (e.g., RAM), a processor circuitry block (e.g., a microprocessor, a multi-core microprocessor, graphics processor, or the like), either or both of which include multi-finned transistors having fins anchored over a dielectric material. The monolithic SoC 1550 may be further coupled to a board, a substrate, or an interposer 1560 along with, one or more of a power management integrated circuit (PMIC) 1530, RF (wireless) integrated circuit (RFIC) 1525 including a wideband RF (wireless) transmitter and/or receiver (TX/RX) (e.g., including a digital baseband and an analog front end module further comprises a power amplifier on a transmit path and a low noise amplifier on a receive path), and a controller 1535. Any or all of RFIC 1525 and PMIC 1530 may also include including multi-finned transistors having fins anchored over a dielectric material, in accordance with embodiments described herein.

Functionally, PMIC 1530 may perform battery power regulation, DC-to-DC conversion, etc., and so has an input coupled to battery 1515 and with an output providing a current supply to other functional modules. As further illustrated, in the exemplary embodiment, RFIC 1525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. Notably, each of these board-level IC modules 1525, 1530, 1535 may be integrated onto separate ICs or integrated into monolithic SoC 1550.

Figure 16:
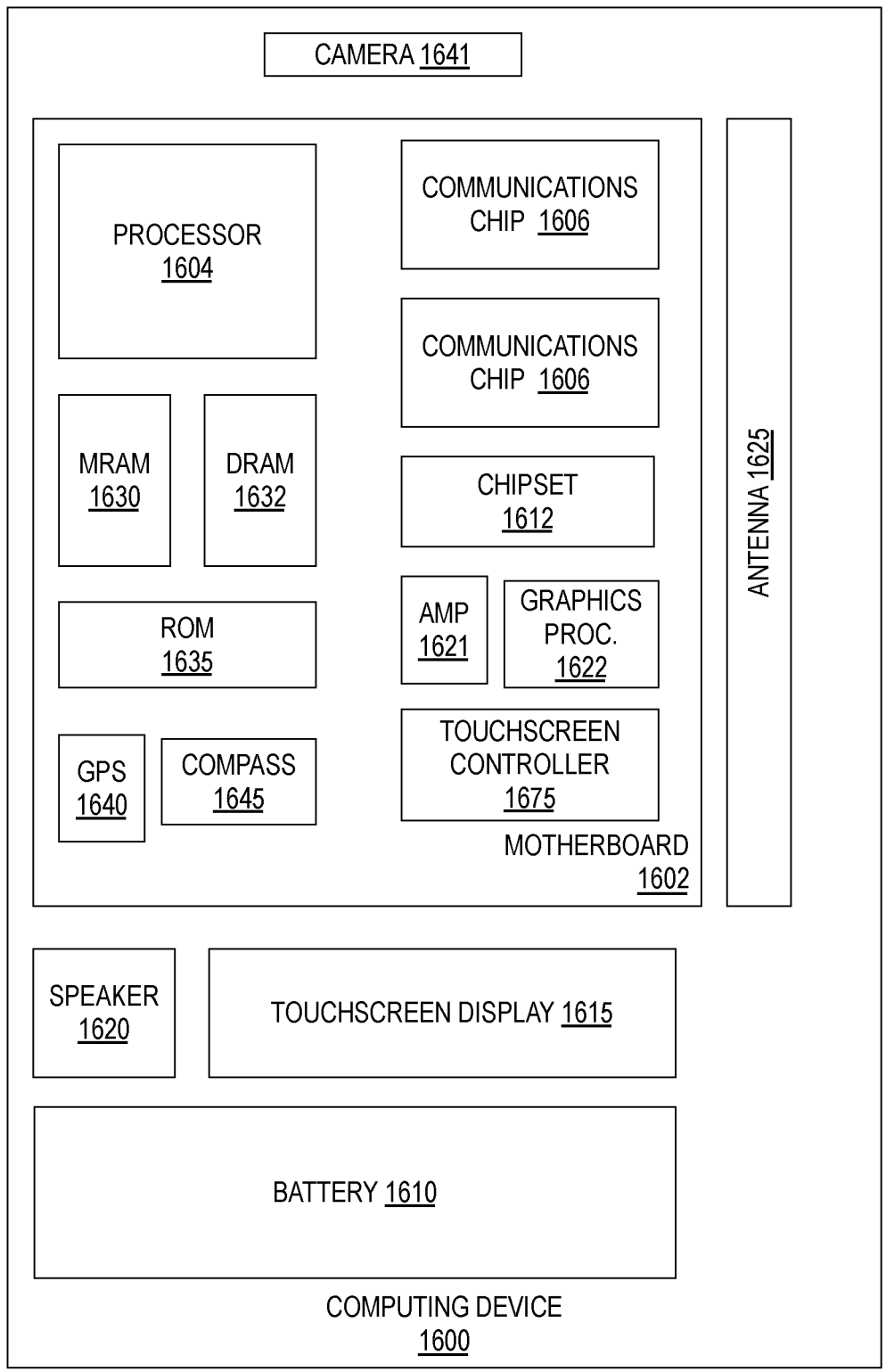
FIG. 16 is a functional block diagram of an electronic computing device, in accordance with an embodiment of the present invention.

FIG. 16 is a functional block diagram of an electronic computing device 1600, in accordance with some embodiments. Computing device 1600 may be found inside platform 1505 or server machine 1506, for example. Device 1600 further includes a motherboard 1602 hosting a number of components, such as, but not limited to, a processor 1604 (e.g., an applications processor), which may further including multi-finned transistors having fins anchored over a dielectric material, in accordance with embodiments described herein. Processor 1604 may be physically and/or electrically coupled to motherboard 1602. In some examples, processor 1604 includes an integrated circuit die packaged within the processor 1604. In general, the term "processor" or "microprocessor" may refer to any device or portion of a device that processes electronic data from registers and/or memory to transform that electronic data into other electronic data that may be further stored in registers and/or memory.

In various examples, one or more communication chips 1606 may also be physically and/or electrically coupled to the motherboard 1602. In further implementations, communication chips 1606 may be part of processor 1604. Depending on its applications, computing device 1600 may include other components that may or may not be physically and electrically coupled to motherboard 1602. These other components include, but are not limited to, volatile memory (e.g., MRAM 1630, DRAM 1632), non-volatile memory (e.g., ROM 1635), flash memory, a graphics processor 1622, a digital signal processor, a crypto processor, a chipset, an antenna 1625, touchscreen display 1615, touchscreen controller 1675, battery 1610, audio codec, video codec, power amplifier 1621, global positioning system (GPS) device 1640, compass 1645, accelerometer, gyroscope, audio speaker 1620, camera 1641, and mass storage device (such as hard disk drive, solid-state drive (SSD), compact disk (CD), digital versatile disk (DVD), and so forth), or the like.

Communication chips 1606 may enable wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1606 may implement any of a number of wireless standards or protocols, including but not limited to those described elsewhere herein. As discussed, computing device 1600 may include a plurality of communication chips 1606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In first examples, a transistor structure comprises a plurality of fins comprising a crystalline material, wherein the fins are spaced apart over a dielectric layer, wherein a first number of the plurality of fins are on a first side of a fin template trench that extends through the dielectric layer, and wherein a second number of the plurality of fins, equal to the first number, are on a second side of the fin template trench. One or more materials within at least a portion of the fin template trench. A gate dielectric and a gate electrode over sidewalls of the fins. A source and a drain coupled to the fins on opposite sides of the gate electrode.

In second examples, for any of the first examples the fins comprise a first crystalline material and the one or more materials comprise a second crystalline material having a different composition than the first crystalline material.

In third examples, for any of the second examples the first crystalline material comprises at least a first of Si or Ge, and the second crystalline material comprises at least a second of Si or Ge.

In fourth examples, for any of the second examples the first crystalline material comprises at least one of Si, Ge or a first III-V alloy, and the second crystalline material comprises a second III-V alloy.

In fifth examples, for any of the first through the fourth examples the dielectric layer comprises a first dielectric material and the one or more materials within the fin template trench comprises a second dielectric material.

In sixth examples, for any of the first through the fifth examples the fins have a first height above a top of the dielectric layer, and the one or more materials within the fin template trench have a second height that is less that the fin height.

In seventh examples, for any of the first through the sixth examples the first number of the fins are each spaced apart by a first distance, the second number of the fins are each spaced apart by the first distance and the first number of the fins are spaced apart from the second number of the fins by a second distance that is larger than the first distance.

In eighth examples, for any of the seventh examples the first distance no more than 9 nm, and the second distance is larger than 9 nm.

In ninth examples, for any of the first through the eighth examples a width of each of the fins is no more than 5 nm, and a height of the fins above a top of the dielectric layer is at least 20 nm.

In tenth examples, an integrated circuit (IC) device comprises a first transistor structure comprising a plurality of first fins comprising a first crystalline material, wherein the first fins are spaced apart over a dielectric layer, wherein a first number of the first fins are on a first side of a first fin template trench that extends through the dielectric layer, wherein a second number of the first fins, equal to the first number, are on a second side of the first fin template trench, and wherein a first fin template comprising the first crystalline material is within at least a portion of the first fin template trench. The first transistor structure comprises a first gate dielectric and a first gate electrode over sidewalls of the first fins. The first transistor structure comprises a first source and a first drain coupled to the first fins on opposite sides of the first gate electrode. IC device comprises a second transistor structure, comprising a plurality of second fins comprising a second crystalline material, wherein the second fins are spaced apart over the dielectric layer, wherein a first number of the second fins are on a first side of a second fin template trench that extends through a least a portion of the dielectric layer, wherein a second number of the second fins, equal to the first number of the second fins, are on a second side of the fin template trench, and wherein a second fin template comprising the first crystalline material is within at least a portion of the second fin template trench. The second transistor structure comprises a second gate dielectric and a second gate electrode over sidewalls of the second fins. The second transistor structure comprises a second source and a second drain coupled to the second fins on opposite sides of the second gate electrode.

In eleventh examples, for any of the tenth examples the first gate dielectric and the first gate electrode are over a sidewall of the first fin template, and the second gate dielectric and the second gate electrode are absent from a sidewall of the second fin template.

In twelfth examples for any of the tenth examples the first crystalline material comprises at least a first of Si or Ge, and the second crystalline material comprises at least a second of Si or Ge, or the first crystalline material comprises a Group III constituent and a Group IV constituent, and the second crystalline material comprises a Group IV constituent, or the first crystalline material comprises at least one of Si or Ge, and the second crystalline material comprises a Group III constituent and a Group IV constituent.

In thirteenth examples, for any of the tenth through twelfth examples the first source and the first drain comprise a p-type impurity, and wherein the second source and the second drain comprise an n-type impurity.

In fourteenth examples a computer platform comprises a data storage means to store data, and a data processing means coupled to the data storage means, wherein the data processing means includes a plurality of transistors, at least one of which comprises the transistor structure of any one of the first through the eighth examples.

In fifteenth examples, a method of fabricating a transistor comprises receiving a workpiece including a fin template within a trench, wherein the trench extends through a dielectric layer, and the fin template has a sidewall extending above the dielectric layer. The method comprises epitaxially growing a superlattice structure from the sidewall of the fin template, wherein the superlattice comprises a first layer having a first composition between two second layers having a second composition. The method comprises exposing the first layer and second layers by planarizing the superlattice structure. The method comprises exposing a sidewall of the first layer by removing the second layers. The method comprises forming a source and a drain coupled to the first layer. The method comprises forming a gate stack over the sidewall of the first layer and between the source and drain, wherein the gate stack comprises a gate dielectric and a gate electrode.

In sixteenth examples, for any of the fifteenth examples the sidewall of the first layer has a first height, the fin template comprises the second composition, and removing the second layers also recesses the fin template to a second height that is less than the first height.

In seventeenth examples for any of the fifteenth or sixteenth examples the second height is recessed below a top surface of the dielectric material; and the method further comprises depositing a second dielectric material after recessing the fin template, and recessing the second dielectric material to re-expose at least a portion of the sidewall of the first layer.

In eighteenth examples, for any of the fifteenth through seventeenth examples growing the superlattice structure comprises growing a plurality of bi-layers, each bi-layer comprises the first layer and the second layer, exposing the first layer and second layers comprises exposing the first and second layers of each of the plurality of bi-layers, exposing the sidewall of the first layer comprises exposing a sidewall of a plurality of the first layers, forming a source and a drain coupled to the first layer comprises forming a source and drain coupled to the plurality of the first layers, and forming a gate stack over the sidewall of the first layer comprises forming the gate stack over the plurality of the first layers.

In nineteenth examples, for any of the fifteenth through eighteenth examples the method comprises bifurcating the first layer into a first segment on a first side of the fin template, and a second segment one a second side of the fin template. Forming the source and a drain further comprises forming a source and drain to the first segment and to the second segment. Forming the gate stack further comprises forming the gate stack over both the first segment and second segment.

In twentieth examples, for any of the fifteenth through nineteenth examples the method comprises forming a trench in the dielectric layer, the trench exposing a surface of a crystalline substrate, epitaxially growing the fin template within the trench, and recessing the dielectric layer to expose the sidewall of the fin template.

In twenty-first examples, for any of the fifteenth through twentieth examples the method comprises forming the fin template by etching a crystalline substrate.

In twenty-second examples, for any of the fifteenth through twenty-first examples the method further comprises depositing a dielectric material over the superlattice structure. Planarizing the superlattice structure further comprises planarizing the dielectric material.

In twenty-third examples, for any of the fifteenth through twenty-second examples the first composition comprises at least a first of Si or Ge, and the second composition comprises at least a second of Si or Ge, or wherein the first crystalline material comprises a first III-V alloy and the second crystalline material comprises at least one of Si, Ge, or a second III-V alloy.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor structure, comprising:
 a plurality of fins comprising a crystalline material, wherein the fins are spaced apart over a dielectric material, wherein a first number of the plurality of fins are on a first side of a fin template trench that extends through the dielectric material, and wherein a second number of the plurality of fins, equal to the first number, are on a second side of the fin template trench, wherein the first number of the fins are each spaced apart by a first distance, the second number of the fins are each spaced apart by the first distance;

an adjacent dielectric material spaced apart from a first of the fins on the first side by the first distance, and spaced apart from a second of the fins on the second side by the first distance;

one or more materials within at least a portion of the fin template trench;

a gate dielectric and a gate electrode over a sidewall of the fins; and a source and a drain coupled to the fins on opposite sides of the gate electrode.

2. The transistor structure of claim 1, wherein the fins comprise a first crystalline material, and the one or more materials within the fin template trench comprise a second crystalline material having a different composition than the first crystalline material.

3. The transistor structure of claim 2, wherein the first crystalline material comprises at least a first of Si or Ge, and the second crystalline material comprises at least a second of Si or Ge.

4. The transistor structure of claim 2, wherein the first crystalline material comprises at least one of Si, Ge or a first III-V alloy, and the second crystalline material comprises a second III-V alloy.

5. The transistor structure of claim 1, wherein the dielectric material comprises a first dielectric material and the one or more materials within the fin template trench comprise a second dielectric material.

6. The transistor structure of claim 1, wherein the fins have a first height above a top of the dielectric layer, and the one or more materials within the fin template trench have a second height that is less that the fin height.

7. The transistor structure of claim 1, wherein the first number of the fins are spaced apart from the second number of the fins by a second distance that is larger than the first distance.

8. The transistor structure of claim 7, wherein the first distance is no more than 9 nm, and the second distance is larger than 9 nm.

9. A computer platform, comprising:
a data storage means to store data; and
a data processing means coupled to the data storage means, wherein the data processing means includes a plurality of transistors, at least one of which comprises the transistor structure of claim 1.

* * * * *